United States Patent
Ryu et al.

(10) Patent No.: US 12,557,527 B2
(45) Date of Patent: Feb. 17, 2026

(54) DISPLAY APPARATUS HAVING IRREVERSIBLE DISCOLORATION MATERIAL LAYER

(71) Applicant: Samsung Display Co., Ltd., Yongin-si (KR)

(72) Inventors: Sena Ryu, Yongin-si (KR); Minsung Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 653 days.

(21) Appl. No.: 17/551,464

(22) Filed: Dec. 15, 2021

(65) Prior Publication Data
US 2022/0199951 A1    Jun. 23, 2022

(30) Foreign Application Priority Data
Dec. 18, 2020  (KR) .................. 10-2020-0178927

(51) Int. Cl.
| H10K 59/80 | (2023.01) |
| H10K 59/12 | (2023.01) |
| H10K 59/65 | (2023.01) |

(52) U.S. Cl.
CPC .......... *H10K 59/873* (2023.02); *H10K 59/12* (2023.02); *H10K 59/1201* (2023.02); *H10K 59/65* (2023.02)

(58) Field of Classification Search
CPC ...... H10K 50/844; H10K 59/65; H10K 59/12; H10K 59/1201; H10K 71/00; H10K 59/873

USPC ...................................................... 257/40, 59
See application file for complete search history.

(56) References Cited

U.S. PATENT DOCUMENTS

| 8,569,208 | B1* | 10/2013 | Ribi | G01N 31/222 503/201 |
| 10,180,413 | B2 | 1/2019 | Hishikawa et al. | |
| 10,263,203 | B2 | 4/2019 | Oh et al. | |
| 10,388,713 | B2 | 8/2019 | Son et al. | |
| 2009/0289202 | A1* | 11/2009 | Yakimov | H10K 71/70 250/474.1 |
| 2014/0106963 | A1* | 4/2014 | Ribi | B41M 5/3333 436/39 |
| 2014/0275381 | A1* | 9/2014 | Ribi | C08J 3/22 524/549 |
| 2016/0024321 | A1* | 1/2016 | Wang | C09D 11/50 523/122 |
| 2018/0201000 | A1 | 7/2018 | Kim et al. | |

(Continued)

FOREIGN PATENT DOCUMENTS

| JP | 2018053064 A | 4/2018 |
| KR | 1020170050732 A | 5/2017 |

(Continued)

*Primary Examiner* — Eric W Jones
(74) *Attorney, Agent, or Firm* — CANTOR COLBURN LLP

(57) ABSTRACT

A display apparatus includes a substrate including a component area and a display area, a display layer, and a first coating layer facing the display layer with the substrate therebetween, the first coating layer including an irreversible discoloration material having an initial color, a first colorless area corresponding to the component area and a first colored area corresponding to the display area and defined by a portion of the irreversible discoloration material having the initial color.

14 Claims, 12 Drawing Sheets

(56) References Cited

U.S. PATENT DOCUMENTS

| | | | | |
|---|---|---|---|---|
| 2019/0158713 A1* | 5/2019 | Mcmillan | ............... | H04N 7/142 |
| 2019/0243154 A1* | 8/2019 | Hai | .................... | G06V 40/1318 |
| 2019/0293849 A1* | 9/2019 | Du | ......................... | G02B 5/223 |
| 2020/0127231 A1* | 4/2020 | Yun | ...................... | H10K 59/873 |
| 2020/0236259 A1* | 7/2020 | Nakamura | ........ | G02F 1/133345 |
| 2020/0287161 A1* | 9/2020 | Kim | ....................... | H10K 50/15 |
| 2021/0259093 A1 | 8/2021 | Park | | |

FOREIGN PATENT DOCUMENTS

| | | |
|---|---|---|
| KR | 101748753 B1 | 7/2017 |
| KR | 1020170091093 A | 8/2017 |
| KR | 10-1862251 B1 | 5/2018 |
| KR | 20180082717 A | 7/2018 |
| KR | 1020180079580 A | 7/2018 |
| KR | 10-1980239 B1 | 5/2019 |
| KR | 1020210104512 A | 8/2021 |

\* cited by examiner

DISPLAY APPARATUS HAVING IRREVERSIBLE DISCOLORATION MATERIAL LAYER

This application claims priority to Korean Patent Application No. 10-2020-0178927, filed on Dec. 18, 2020, and all the benefits accruing therefrom under 35 U.S.C. § 119, the disclosure of which is incorporated herein in its entirety by reference.

BACKGROUND

1. Field

One or more embodiments relate to display apparatuses and methods of providing or manufacturing the same. More particularly, one or more embodiments relate to a display apparatus including a component area, and a method of providing or manufacturing the display apparatus.

2. Description of the Related Art

Applications of conventional display apparatuses have diversified. Also, due to relatively small thickness and light weight of the conventional display apparatuses, the application range thereof has increased.

The area occupied by a display area of a display apparatus has been increased, and also various functions which may be applied or linked to the display apparatus have been added to the display apparatus. To increase the area occupied by a display area and also add the various functions, research has been carried out on display apparatuses having, within a display area, an area for adding various functions other than image display.

SUMMARY

A display apparatus includes a component area which transmits light, as an area for adding various functions to the display apparatus which are different from an image-display function thereof. Low light transmittance of the component area or reflection of transmitted light may decrease display quality of the image.

In order to address several drawbacks including the aforementioned drawback, one or more embodiments include a display apparatus including a component area with improved light transmittance and providing a reduced light reflectance, and a method of providing or manufacturing the same. However, the one or more embodiments are only examples, and the scope of the disclosure is not limited thereto.

Additional features will be set forth in part in the description which follows and, in part, will be apparent from the description, or may be learned by practice of the embodiments of the disclosure According to one or more embodiments, a display apparatus includes a substrate including a component area, and a display area which surrounds at least a portion of the component area, a display layer on an upper surface of the substrate, a protective film on a lower surface of the substrate such that an upper surface of the protective film faces the substrate, and a first coating layer on a lower surface of the protective film such that an upper surface of the first coating layer faces the protective film, the first coating layer including an irreversible discoloration material, a first colorless area corresponding to the component area and a first colored area corresponding to the display area.

The first colored area and the first colorless area may be integrated with each other.

A distance between a lower surface of the first coating layer and the lower surface of the protective film in the first colorless area may be equal to a distance between the lower surface of the first coating layer and the lower surface of the protective film in the first colored area.

The first colorless area may be an area where the irreversible discoloration material is changed from a colored material to a colorless material.

The irreversible discoloration material may be an irreversible hydrochromic material which is changed from a colored material to a colorless material upon contact with moisture.

The display apparatus may further include a second coating layer between the protective film and the substrate such that an upper surface of the second coating layer faces the substrate, the second coating layer including the irreversible discoloration material and having a second colorless area corresponding to the component area and a second colored area corresponding to the display area.

The second colored area and the second colorless area may be integrated with each other.

A distance between an upper surface of the second coating layer and the upper surface of the protective film in the second colorless area may be equal to a distance between the upper surface of the second coating layer and the upper surface of the protective film in the second colored area.

The second colorless area may be an area where the irreversible discoloration material is changed from a colored material to a colorless material.

The irreversible discoloration material may be an irreversible hydrochromic material which is changed from a colored material to a colorless material upon contact with moisture.

According to one or more embodiments, a display apparatus includes a substrate having a component area, and a display area which surrounds at least a portion of the component area, a display layer on an upper surface of the substrate, a third coating layer on a lower surface of the substrate such that an upper surface of the third coating layer faces the substrate, the third coating layer including an irreversible discoloration material and having a third colorless area corresponding to the component area and a third colored area corresponding to the display area, and a protective film on a lower surface of the third coating layer such that an upper surface of the protective film faces the third coating layer.

The third colored area and the third colorless area may be integrated with each other.

A distance between the lower surface of the third coating layer and the lower surface of the substrate in the third colorless area may be equal to a distance between the lower surface of the third coating layer and the lower surface of the substrate in the third colored area.

The third colorless area may be an area where the irreversible discoloration material is changed from a colored material to a colorless material.

The irreversible discoloration material may be an irreversible hydrochromic material which is changed from a colored material to a colorless material.

According to one or more embodiments, a method of manufacturing a display apparatus includes an operation of providing a first coating layer on a lower surface of a protective film, the first coating layer including an irreversible discoloration material, and arranging first release paper on a lower surface of the first coating layer, an operation of providing, on an upper surface of the protective film, a substrate having a component area and a display area surrounding at least a portion of the component area, and a display layer on an upper surface of the substrate, and an operation of patterning the first coating layer such that the first coating layer has a first colorless area corresponding to the component area and a first colored area corresponding to the display area.

The operation of patterning the first coating layer may include an operation of providing an opening in an area of the first release paper which corresponds to the component area, and an operation of providing the first colorless area where the irreversible discoloration material changed from a colored material to a colorless material, in an area of the first coating layer which overlaps the opening of the first release paper.

The irreversible discoloration material may be an irreversible hydrochromic material which is changed from a colored material to a colorless material upon contact with moisture, and the operation of providing the first colorless area may include an operation of supplying moisture to the lower surface of the first coating layer exposed via the opening of the first release paper, and an operation of drying the moisture after a time period has lapsed.

The first colored area and the first colorless area may be integrated with each other.

A distance between a lower surface of the third coating layer and the lower surface of the protective film in the first colorless area may be equal to a distance between the lower surface of the third coating layer and the lower surface of the protective film in the first colored area.

The method may further include an operation of providing a second coating layer on the upper surface of the protective film, the second coating layer including the irreversible discoloration material, and arranging second release paper on an upper surface of the second coating layer, and an operation of patterning the second coating layer such that the second coating layer has a second colorless area corresponding to the component area and a second colored area corresponding to the display area, where the operation of providing the substrate and the display layer includes providing the substrate and the display layer on the upper surface of the second coating layer.

The operation of patterning the second coating layer may include an operation of providing an opening in an area of the second release paper which corresponds to the component area, and an operation of providing the second colorless area where the irreversible discoloration material changed from a colored material to a colorless material, in an area of the second coating layer which overlaps the opening of the second release paper.

According to one or more of the embodiments, the irreversible discoloration material may be an irreversible hydrochromic material which is changed from a colored material to a colorless material upon contact with moisture, and the operation of providing the second colorless area may include an operation of supplying moisture to the upper surface of the second coating layer exposed via the opening of the second release paper, and an operation of drying the moisture after a preset time period has lapsed.

The second colored area and the second colorless area may be integrated with each other.

A distance between an upper surface of the second coating layer and the upper surface of the protective film in the second colorless area may be equal to a distance between the upper surface of the second coating layer and the upper surface of the protective film in the second colored area.

These and/or other features will become apparent and more readily appreciated from the following description of the embodiments, the claims, and the accompanying drawings.

These embodiments may be implemented by using a system, a method, a computer program or a combination thereof.

BRIEF DESCRIPTION OF THE DRAWINGS

The above and other features and advantages of embodiments of the disclosure will be more apparent from the following description taken in conjunction with the accompanying drawings, in which.

DETAILED DESCRIPTION

Figure 1:
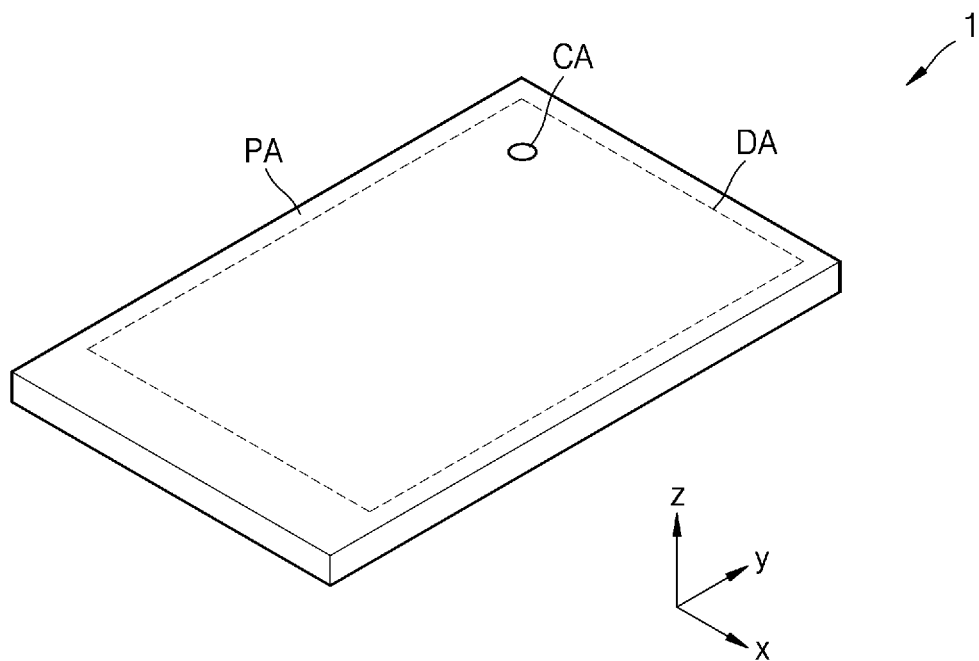
FIG. 1 is a schematic perspective view of an embodiment of a portion of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the figures, to explain features of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, embodiments will be illustrated in the drawings and described in detail in the written description. Hereinafter, effects and features of the disclosure and a method for accomplishing them will be described more fully with reference to the accompanying drawings, in which embodiments of the disclosure are shown. The disclosure may, however, be embodied in many different forms and should not be construed as limited to the embodiments set forth herein.

One or more embodiments of the disclosure will be described below in more detail with reference to the accompanying drawings. Those components that are the same as or are in correspondence with each other are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

The terminology used herein is for the purpose of describing particular embodiments only and is not intended to be limiting. As used herein, the singular forms "a," "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or."

It will be further understood that the terms "comprises" and/or "comprising" used herein specify the presence of stated features or components, but do not preclude the presence or addition of one or more other features or components.

It will be understood that when a layer, region or component is referred to as being related to another element such as being "on" another layer, region, or component, it can be directly or indirectly on the other layer, region or component. That is, for example, intervening layers, regions, or components may be present. In contrast, when a layer, region or component is referred to as being related to another element such as being "directly on" another layer, region, or component, no intervening layers, regions or components are present therebetween.

Sizes of elements in the drawings may be exaggerated for convenience of explanation. In other words, since sizes and thicknesses of components in the drawings are arbitrarily illustrated for convenience of explanation, the following embodiments are not limited thereto.

When an embodiment may be implemented differently, a specific process order within a method may be performed differently from the described order. For example, two consecutively described processes may be performed substantially at the same time or performed in an order opposite to the described order.

In the present specification, "A and/or B" represents A or B, or A and B. The expression "at least one of A and B" indicates only A, only B, both A and B, or variations thereof.

It will also be understood that when a layer, region or component is referred to as being "connected" or "coupled" to another layer, region or component, it can be directly connected or coupled to the other layer, region, or/and component or intervening layers, regions or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. In contrast, when a layer, region or component is referred to as being "directly connected" or "directly coupled" to another layer, region or component, no component or intervening layers, regions or components are present therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described more fully with reference to the accompanying drawings.

FIG. 1 is a schematic perspective view of an embodiment of a portion of a display apparatus 1.

Referring to FIG. 1, a display apparatus 1 includes a display area DA at which light is emitted, and a peripheral area PA at which no light is emitted. The peripheral area PA may be adjacent to the display area DA. In an embodiment, the peripheral area PA may surround an entirety of the display area DA. Within the display apparatus 1, various layers and components such as a base substrate may include a first area which corresponds to the display area DA described above and a second area which corresponds to the peripheral area PA described above. Pixel circuits PC to be described later and light-emitting diodes which are electrically connected to the pixel circuits PC may be arranged in the first area of the base substrate.

FIG. 1 illustrates the display area DA of the display apparatus 1 is rectangular. However, the planar shape of the display area DA may be an arbitrary shape such as a circle, an oval or a polygon.

Figure 2:
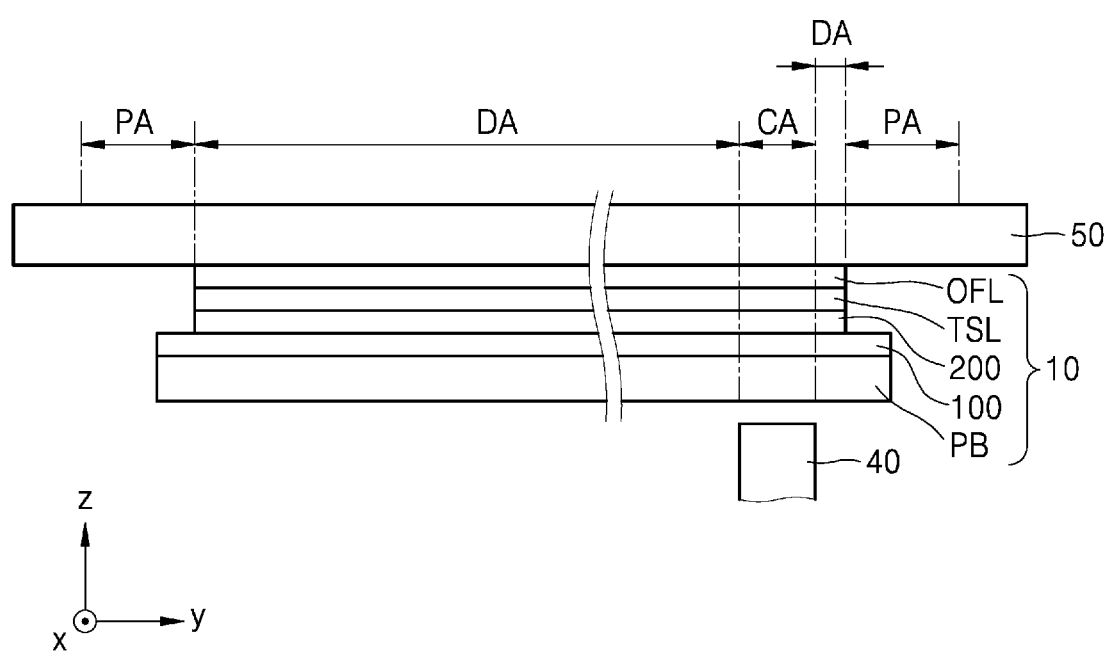
FIG. 2 is a schematic cross-sectional view of an embodiment of a portion of a display apparatus.

According to an embodiment, the display apparatus 1 may include a component area CA. The component area CA may be arranged within a planar area of the display area DA, and at least a portion thereof may be surrounded by the display area DA. According to an embodiment, the component area CA may be entirely surrounded by the display area DA. Because the component area CA is a planar area where a component 40 (e.g., functional component) of FIG. 2 is arranged, the display apparatus 1 may have various functions by using a component 40. Within the display apparatus 1, various layers and components may include a component area CA which corresponds to that described above for the display apparatus 1.

In FIG. 1, the component area CA is arranged to be offset to the left side of the display area DA along a width direction (e.g., a ±x direction) of the display apparatus 1. However, according to embodiments, the component area CA may be arranged at a center portion of the display area DA or may be arranged to be offset to the right side along the width direction of the display apparatus 1. Alternatively, the component area CA may be arranged at various locations of the display apparatus 1, such as being arranged on an upper side, a center or a lower side along a length direction (e.g., a ±y direction) of the display apparatus 1. Alternatively, the component area CA may be arranged as a bar shape or notch type (shape) at one side of the display apparatus 1.

The display apparatus 1 and various layers and components thereof may be disposed in a plane defined by a first direction (e.g., along the x direction) and a second direction (e.g., along the y direction) which cross each other. A thickness direction of the display apparatus 1 and various layers and components thereof may be taken along a third direction (e.g., along a z direction).

In FIG. 1, the display apparatus 1 includes a single one of the component area CA. However, according to an embodiment, the display apparatus 1 may include the component area CA provided in plural including a plurality of component areas CA.

FIG. 2 is a schematic cross-sectional view of an embodiment of a portion of a display apparatus 1.

Referring to FIG. 2, the display apparatus 1 may include a display panel 10, a component 40 and a cover window 50.

The display panel 10 may be a light-emitting display panel including a light-emitting element such as a display element DPE. In an embodiment, for example, the display panel 10 may be an organic light-emitting display panel using an organic light-emitting diode OLED including an organic emission layer, a micro light-emitting diode ("LED") display panel using a micro LED, a quantum dot light-emitting display panel using a quantum dot LED including a quantum dot emission layer, or an inorganic light-emitting display panel using an inorganic light-emitting element including an inorganic semiconductor.

The display panel 10 may be a rigid display panel having rigidity and thus not being easily bendable or foldable, or a flexible display panel having flexibility and thus being easily bendable, foldable or rollable. In an embodiment, for example, the display panel 10 may be a foldable display panel, a curved or curvable display panel having a curved display surface, a bendable display panel of which an area other than a display surface is bendable, a rollable display panel or a stretchable display panel.

The display panel 10 may include a substrate 100 (e.g., base substrate), a display layer 200, a touch screen layer TSL, an optical functional layer OFL and a panel protection member PB.

The substrate 100 may include an insulative material, such as glass, quartz or polymer resin. The substrate 100 may be a rigid substrate or a flexible substrate that is bendable, foldable and/or rollable. In an embodiment, for example, the substrate 100 may include polymer resin such as polyethersulfone, polyacrylate, polyetherimide, polyethylene naphthalate, polyethylene terephthalate, polyphenylene sulfide, polyarylate, polyimide, polycarbonate or cellulose acetate propionate. The substrate 100 may have a multi-layered structure including a layer including the aforementioned polymer resin, and an inorganic layer. In an embodiment, for example, the substrate 100 may include two layers including the aforementioned polymer resin and an inorganic barrier layer which is between the two layers.

The display layer 200 may be on the substrate 100. The display layer 200 may include pixels P, and may be a layer which generates and/or displays an image. The display layer 200 may include a circuit layer including thin-film transistors, a display element layer in which display elements DPE are arranged, and an encapsulation member ENCM which encapsulates the display element layer.

The display layer 200 may be divided into a portion corresponding to the display area DA and a portion corresponding to the peripheral area PA. The display area DA may be a planar area that includes pixels P arranged therein and generates and/or displays an image. The peripheral area PA may be a planar area that is outside the display area DA and does not display an image. The peripheral area PA may be adjacent to the display area DA, and may be arranged to surround the display area DA. The peripheral area PA may be a planar area extending from an outside edge of the display area DA to an outside edge of the display panel 10. In the display area DA, not only the pixels P but also pixel circuits PC which drive the pixels P, along with scan lines, data lines and power lines connected to the pixel circuits PC may be arranged. In the peripheral area PA, a scan driving unit which applies scan signals to the scan lines, and fan out lines that connect the data lines to a display driving unit may be arranged.

In the display apparatus 1, various functional layers may be arranged on the display layer 200. According to an embodiment, a functional layer such as the touch screen layer TSL may be on the display layer 200. The touch screen layer TSL includes touch electrodes, and may sense an external input to the display apparatus 1 (e.g., input-sensing layer).

The touch screen layer TSL may be directly provided or formed on an encapsulation member ENCM of the display layer 200. Alternatively, the touch screen layer TSL may be separately provided from the display layer 200 and then coupled to an upper surface of the encapsulation member ENCM of the display layer 200 via an adhesive layer, such as an optically clear adhesive ("OCA"). As being directly provided on or in contact, elements may form an interface therebetween, without being limited thereto.

The optical functional layer OFL may be on the touch screen layer TSL. The optical functional layer OFL may include an anti-reflection layer. The anti-reflection layer may reduce the reflectivity of light that is incident from an external source (e.g., external light) toward the display apparatus 1.

According to embodiments, the anti-reflection layer may include a polarization film. The polarization film may include a linear planarization plate and a phase delay film such as a quarter-wave (λ/4) plate. The phase delay film may be on the touch screen layer TSL, and the linear planarization plate may be on the phase delay film. That is, the phase delay film may be between the touch screen layer TSL and the linear polarization plate.

The cover window 50 may be on the optical functional layer OFL. The cover window 50 may be attached to an upper surface of the optical functional layer OFL by a transparent adhesive member such as an OCA film.

The panel protection member PB may be below the substrate 100. The panel protection member PB may be attached to a lower surface of the display panel 10 by using an adhesive member. The adhesive member may be a pressure sensitive adhesive ("PSA").

The panel protection member PB may define a panel protection member opening corresponding to the component area CA. The inclusion of the panel protection member opening in the panel protection member PB may improve the light transmittance of the component area CA. The planar area of the component area CA (e.g., within the plane defined by the first and second directions crossing each other) may be equal to or greater than a planar area of the component 40.

The component 40 may be an electronic element that uses light and/or sound to provide a function of the display apparatus 1 (e.g., functional component). The electronic element may be, for example, a sensor for measuring a distance, such as a proximity sensor, a sensor for sensing a part (e.g., a fingerprint, an iris or a face) of the body, a light source such as a small lamp for outputting light, or an image sensor (e.g., a camera) for capturing an image. An electronic element using light may use light in various wavelength bands, such as visible light, infrared light and ultraviolet light. The electronic element using sound may use ultrasonic waves or sounds of other frequency bands.

Light and/or sound of the component 40 may pass through or be transmitted into or out of the display apparatus 1 at the component area CA thereof. To this end, the component area CA may have a higher light transmittance and/or a higher sound transmittance than the display area DA. According to an embodiment, when light is transmitted at the component area CA, a light transmittance in the component area CA may be about 25% or greater or about 30% or greater, for example, about 50% or greater, about 75% or greater, about 80% or greater, about 85% or greater, or about 90% or greater than that of the display area DA.

According to an embodiment, the component 40 may include sub-components, like a light emitter and a light receiver. The light emitter and the light receiver may be integrated with each other, or may be physically separated from each other such that a pair of a light emitter and a light receiver may constitute one of the component 40.

The cover window 50 may be above the display panel 10 to cover an upper surface of the display panel 10. Thus, the cover window 50 may protect the upper surface of the display panel 10.

According to an embodiment, the cover window 50 may be a flexible window. The cover window 50 may protect the display panel 10 by being easily bendable under application of an external force without generating cracks and the like. The cover window 50 may include glass, sapphire or plastic. In an embodiment, for example, the cover window 50 may be tempered glass (e.g., ultra-thin glass ("UTG")) or colorless polyimide ("CPI"). According to an embodiment, the cover window 50 may have a structure in which a flexible polymer layer is arranged on one surface of a glass substrate, or may only include a polymer layer.

Figure 3:
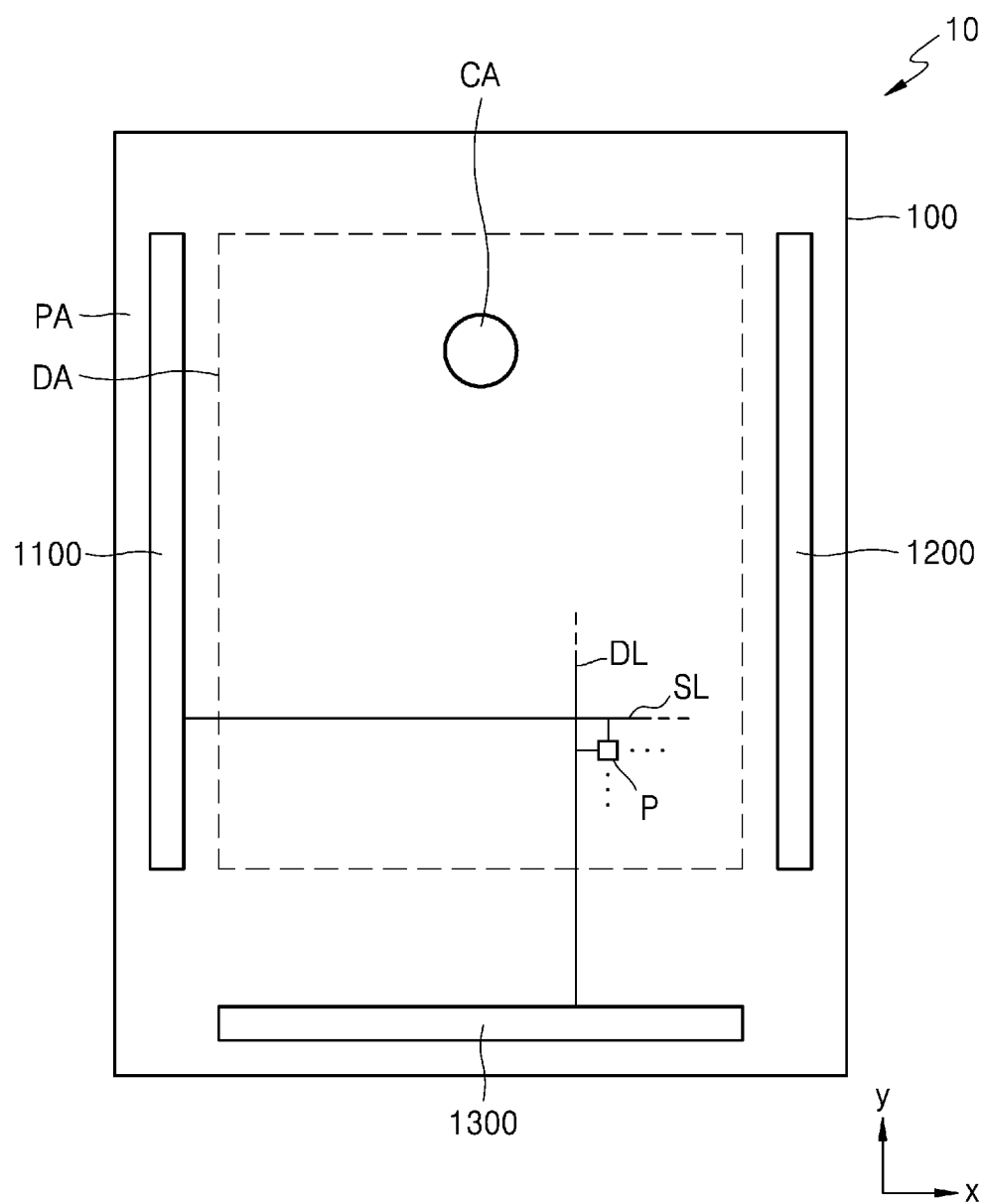
FIG. 3 is a schematic plan view of an embodiment of a portion of a display panel included in a display apparatus.
Figure 4:
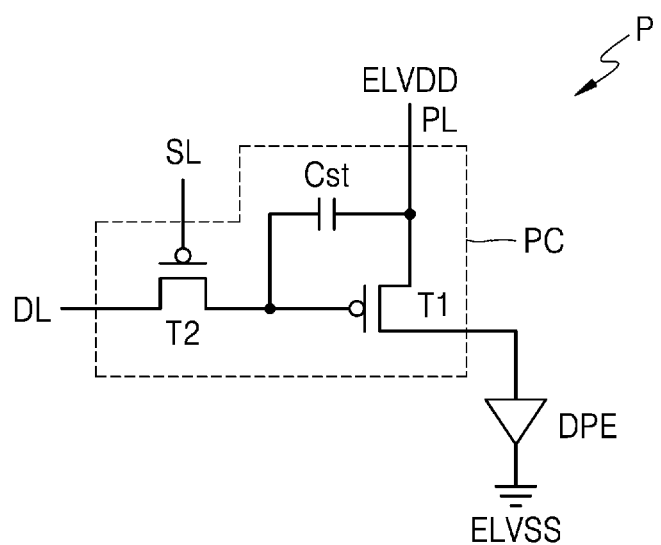
FIG. 4 is an equivalent circuit diagram of an embodiment of a pixel of a display panel.

FIG. 3 is a schematic plan view of an embodiment of a portion of a display panel 10 included in a display apparatus 1, and FIG. 4 is an equivalent circuit diagram of an embodiment of a pixel P included in a display panel 10.

The display panel 10 may include the component area CA, the display area DA which surrounds at least a portion of the component area CA, and a peripheral area PA which is adjacent to the display area DA.

The display panel 10 may include a pixel P provided in plural including a plurality of pixels P arranged in the display area DA. As shown in FIG. 4, each of the plurality of pixels P may include a pixel circuit PC and a display element DPE which is connected to the pixel circuit PC, for example, an organic light-emitting diode OLED. The pixel circuit PC may include a first transistor T1, a second transistor T2 and a storage capacitor Cst. Each of the plurality of pixels P may emit, for example, red light, green light or blue light, or may emit red light, green light, blue light or white light via the organic light-emitting diode OLED. The first transistor T1 and the second transistor T2 may be thin-film transistors.

According to an embodiment, the second transistor T2 which is a switching transistor may be connected to a scan line SL and a data line DL. Based on a switching voltage received via the scan line SL, the second transistor T2 may transmit a data voltage received via the data line DL, to the first transistor T1. The storage capacitor Cst may be connected to the second transistor T2 and a driving voltage line PL, and may store a voltage corresponding to a difference between a voltage received from the second transistor T2 and a first power supply voltage ELVDD supplied to the driving voltage line PL.

The first transistor T1, which is a driving transistor, may be connected to the driving voltage line PL and the storage capacitor Cst, and may control an electrical driving current flowing from the driving voltage line PL to the organic light-emitting diode OLED, in accordance with a voltage value stored in the storage capacitor Cst. The organic light-emitting diode OLED may emit light having a brightness according to the electrical driving current. An opposite electrode (for example, a cathode) of the organic light-emitting diode OLED may receive a second power supply voltage ELVSS.

Although the pixel circuit PC includes two transistors and one of the storage capacitor Cst in FIG. 4, the disclosure is not limited thereto. In other words, the number of transistors included in the pixel circuit PC and the number of storage capacitors included in the pixel circuit PC may vary according to a design of the pixel circuit PC. In an embodiment, for example, the pixel circuit PC may further include four or more thin-film transistors in addition to the aforementioned two thin-film transistors. The pixel circuit PC may further include one or more capacitors in addition to the storage capacitor Cst.

Referring back to FIG. 3, in the peripheral area PA, a first scan driver 1100 and a second scan driver 1200 each providing a scan signal to each of the plurality of pixels P, a data driver 1300 providing a data signal to each of the plurality of pixels P, and main power wires (not shown) for providing the first and second power supply voltages ELVDD and ELVSS may be arranged. The first scan driver 1100 and the second scan driver 1200 may each be located in the peripheral area PA, and may be respectively arranged on opposing sides of the display area DA with the display area DA therebetween.

Although not shown in the drawings, the display panel 10 may include a non-display area (not shown) that surrounds the component area CA. That is, the non-display area may be within the overall display area DA. The non-display area surrounding the component area CA is an area in which the display element DPE for emitting light is not arranged. Signal lines which provide signals to pixels P arranged around the component area CA may traverse the non-display area.

In FIG. 3, the data driver 1300 is located at one edge of the substrate 100 within the display panel 10. In an embodiment, the data driver 1300 may be located on a flexible printed circuit board ("FPCB") which is separate from the display panel 10 and electrically connected to a pad of the display panel 10.

Figure 5A:
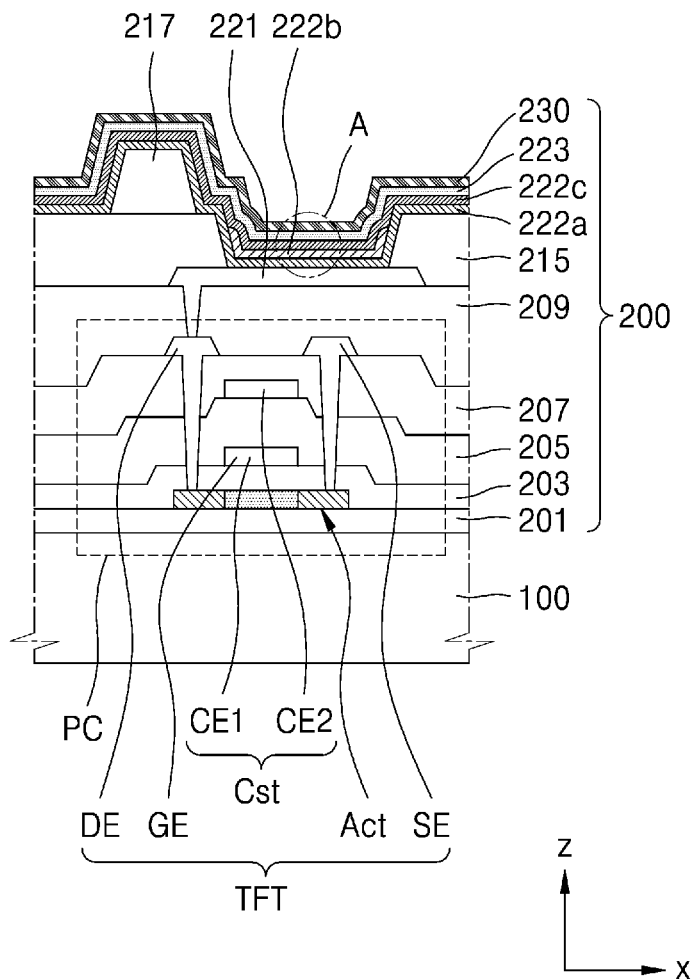
FIG. 5A is a schematic cross-sectional view of a portion of a display panel and FIG. 5B is an enlarged cross-sectional view of region A in FIG. 5A.
Figure 5B:
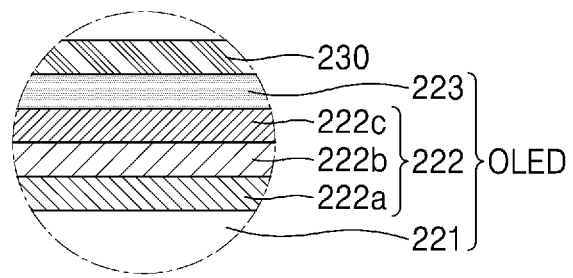

FIG. 5A is a schematic cross-sectional view of an embodiment of a portion of a display panel 10, and FIG. 5B is an enlarged cross-sectional view of region A in FIG. 5A. Referring to FIG. 5A, the pixel circuit PC may be arranged on the substrate 100, and the organic light-emitting diode OLED as the display element DPE of FIG. 4 which is electrically connected to the pixel circuit PC may be arranged on the pixel circuit PC. The substrate 100 may include glass or may include a polymer resin. The substrate 100 may be a single layer or multiple layers.

A buffer layer 201 may be located on the substrate 100. The buffer layer 201 may reduce or prevent infiltration of a foreign material, moisture or ambient air from below the substrate 100 and may increase smoothness of the upper surface to the substrate 100. The buffer layer 201 may include an inorganic material (such as oxide or nitride), an organic material, or an organic and inorganic combination, and may be a single layer or multiple layers of an inorganic material and an organic material. A barrier layer (not shown) may be between the substrate 100 and the buffer layer 201 in order to reduce or effectively prevent infiltration of ambient air.

The pixel circuit PC may be arranged on the buffer layer 201. The pixel circuit PC may include a thin-film transistor TFT and a storage capacitor Cst. The thin-film transistor TFT may include a semiconductor layer Act, a gate electrode GE, a source electrode SE and a drain electrode DE. According to the embodiment, the thin-film transistor TFT is a top gate type in which the gate electrode GE is arranged on the semiconductor layer Act with a gate insulating layer 203 therebetween. In an embodiment, the thin-film transistor TFT may be a bottom gate type.

The semiconductor layer Act may be located on the buffer layer 201. The semiconductor layer Act may include a channel region, and a source region and a drain region respectively located on opposing sides of the channel region and each doped with impurities. The impurities may include N-type impurities or P-type impurities. The semiconductor layer Act may include amorphous silicon or polysilicon. In an embodiment, for example, the semiconductor layer Act may include oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce) and zinc (Zn). The semiconductor layer Act may include Zn oxide, In—Zn oxide, Ga—In—Zn oxide or the like as a Zn oxide-based material. The semiconductor layer Act may be an In—Ga—Zn—O ("IGZO"), In—Sn—Zn—O ("ITZO"), or In—Ga—Sn—Zn—O ("IGTZO") semiconductor containing a metal, such as In, Ga or Sn, in ZnO.

The gate electrode GE is located over the semiconductor layer Act such as to overlap or correspond to at least a portion of the semiconductor layer Act. In detail, the gate electrode GE may overlap the channel region of the semiconductor layer Act. The gate electrode GE may include various conductive materials including molybdenum (Mo), aluminum (Al), copper (Cu) and titanium (Ti), and may have various layered structures. In an embodiment, for example, the gate electrode GE may include a Mo layer and an Al layer or may have a multi-layered structure of Mo/Al/Mo. According to an embodiment, the gate electrode GE may have a multi-layered structure including an ITO layer that covers a metal material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide or hafnium oxide. The gate insulating layer 203 may be a single layer or multi-layer including the aforementioned materials.

Similar to the gate electrode GE, each of the source electrode SE and the drain electrode DE may include various conductive materials including molybdenum (Mo), aluminum (Al), copper (Cu) and titanium (Ti), and may have various layered structures. In an embodiment, for example, each of the source electrode SE and the drain electrode DE may include a Ti layer and an Al layer or may have a multi-layered structure of Ti/Al/Ti. The source electrode SE and the drain electrode DE may be connected to a source region or drain region of the semiconductor layer Act at or through a contact hole. According to an embodiment, each of the source electrode SE and the drain electrode DE may have a multi-layered structure including an ITO layer that covers a metal material.

The storage capacitor Cst may include a lower electrode CE1 and an upper electrode CE2 overlapping each other with a first interlayer insulating layer 205 therebetween. The storage capacitor Cst and the thin-film transistor TFT may overlap or correspond to each other. The lower electrode CE1 and the upper electrode CE2 overlap each other with the first interlayer insulating layer 205 therebetween and form a capacitance. In this case, the first interlayer insulating layer 205 serves as a dielectric layer of the storage capacitor Cst. In this regard, FIG. 5A illustrates the gate electrode GE of the thin-film transistor TFT is the lower electrode CE1 of the storage capacitor Cst. According to an embodiment, the storage capacitor Cst and the thin-film transistor TFT may not overlap each other. The storage capacitor Cst may be covered by a second interlayer insulating layer 207.

The first interlayer insulating layer 205 and the second interlayer insulating layer 207 may each include an inorganic insulating material such as silicon oxide, silicon nitride, silicon oxynitride, aluminum oxide, titanium oxide, tantalum oxide or hafnium oxide. Each of the first interlayer insulating layer 205 and the second interlayer insulating layer 207 may be a single layer or multi-layer including the aforementioned materials.

The gate insulating layer 203 and the first and second interlayer insulating layers 205 and 207 each including such an inorganic material may be provided or formed via chemical vapor deposition ("CVD") or atomic layer deposition ("ALD"), but are not limited thereto.

The pixel circuit PC including the thin-film transistor TFT and the storage capacitor Cst may be covered with an organic insulating layer 209. In an embodiment, for example, the organic insulating layer 209 may cover the source electrode SE and the drain electrode DE. The organic insulating layer 209 may be located over the substrate 100 so as to extend over a display area DA and a peripheral area PA which is outside the display area DA. The organic insulating layer 209 is a planarization insulating layer, and an upper surface thereof may include an approximately flat surface. The organic insulating layer 209 may include an organic insulating material, such as a polymer (such as polymethyl methacrylate ("PMMA") or polystyrene ("PS")), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer or a blend thereof. According to an embodiment, the organic insulating layer 209 may include polyimide.

A pixel electrode 221 may be provided or formed on the organic insulating layer 209. The pixel electrode 221 may include conductive oxide such as indium tin oxide ("ITO"), indium zinc oxide ("IZO"), zinc oxide ("ZnO"), indium oxide ($In_2O_3$), indium gallium oxide ("IGO") or aluminum zinc oxide ("AZO"). According to an embodiment, the pixel electrode 221 may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr) or a combination of these materials. According to an embodiment, the pixel electrode 221 may further include a film including or formed of ITO, IZO, ZnO or $In_2O_3$ above/below the reflection layer.

A pixel defining layer 215 may be provided or formed on the pixel electrode 221. The pixel defining layer 215 may define a pixel opening via which an upper surface of the pixel electrode 221 is exposed to outside the pixel defining layer 215, and may cover an edge of the pixel electrode 221. The pixel defining layer 215 may include an organic insulating material. Alternatively, the pixel defining layer 215 may include an inorganic insulating material such as silicon nitride, silicon oxynitride, or silicon oxide. Alternatively, the pixel defining layer 215 may include an organic insulating material and an inorganic insulating material.

An intermediate layer 222 may include an emission layer 222b. The emission layer 222b may include, for example, an organic material. The emission layer 222b may include a low molecular weight or high molecular weight organic material that emits light of a color. The intermediate layer 222 may include a first functional layer 222a below the emission layer 222b and/or a second functional layer 222c above the emission layer 222b.

The first functional layer 222a may be a single layer or multiple layers. In an embodiment, for example, when the first functional layer 222a includes a high molecular weight material, the first functional layer 222a is a hole transport layer ("HTL") having a single-layered structure, and may include poly-(3,4)-ethylene-dihydroxy thiophene ("PEDOT") and/or polyaniline ("PANI"). When the first functional layer 222a includes a low molecular weight material, the first functional layer 222a may include a hole injection layer ("HIL") and an HTL.

The second functional layer 222c may be optional. In an embodiment, for example, when the first functional layer 222a and the emission layer 222b include high molecular weight materials, the second functional layer 222c may be provided or formed within the intermediate layer 222. The second functional layer 222c may be a single layer or multiple layers. The second functional layer 222c may include an electron transport layer ("ETL") and/or an electron injection layer ("EIL").

The emission layer 222b of the intermediate layer 222 may be arranged in each of a pixel P within the display area DA. The emission layer 222b may be arranged to overlap the pixel opening of the pixel defining layer 215 or/and the pixel electrode 221. Each of the first and second functional layers 222a and 222c of the intermediate layer 222 may be a single body.

An opposite electrode 223 may include a conductive material having a low work function. In an embodiment, for example, the opposite electrode 223 may include a (semi) transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 223 may further include a layer, such as ITO, IZO, ZnO or $In_2O_3$, on the (semi)transparent layer including any of the above-described materials. The opposite electrode 223, which is a single body, may be provided or formed to cover a plurality of pixel electrodes 221 within the display area DA (e.g., a plurality of pixels P). The intermediate layer 222 and the opposite electrode 223 may be provided or formed via thermal deposition.

A spacer 217 may be on the pixel defining layer 215. The spacer 217 may reduce or effectively prevent damage to a light-emitting diode and the like by securing a space over the display element DPE.

The spacer 217 may include an organic insulating material such as polyimide. Alternatively, the spacer 217 may include an inorganic insulating material such as silicon nitride or silicon oxide, or may include an inorganic insulating material and an organic insulating material. The spacer 217 may include a material different from that included in the pixel defining layer 215. Alternatively, the spacer 217 may include the same material as that included in the pixel defining layer 215. In an embodiment, the pixel defining layer 215 and the spacer 217 may be provided or formed together in a mask process using a halftone mask or the like. The pixel defining layer 215 and the spacer 217 may be respective portions or patterns of a same material layer among layers on the substrate 100 so as to be in a same layer as each other.

A capping layer 230 may be located on the opposite electrode 223. The capping layer 230 may include lithium fluoride (LiF), an inorganic material or/and an organic material. According to an embodiment, the capping layer 230 may be omitted.

Figure 6A:
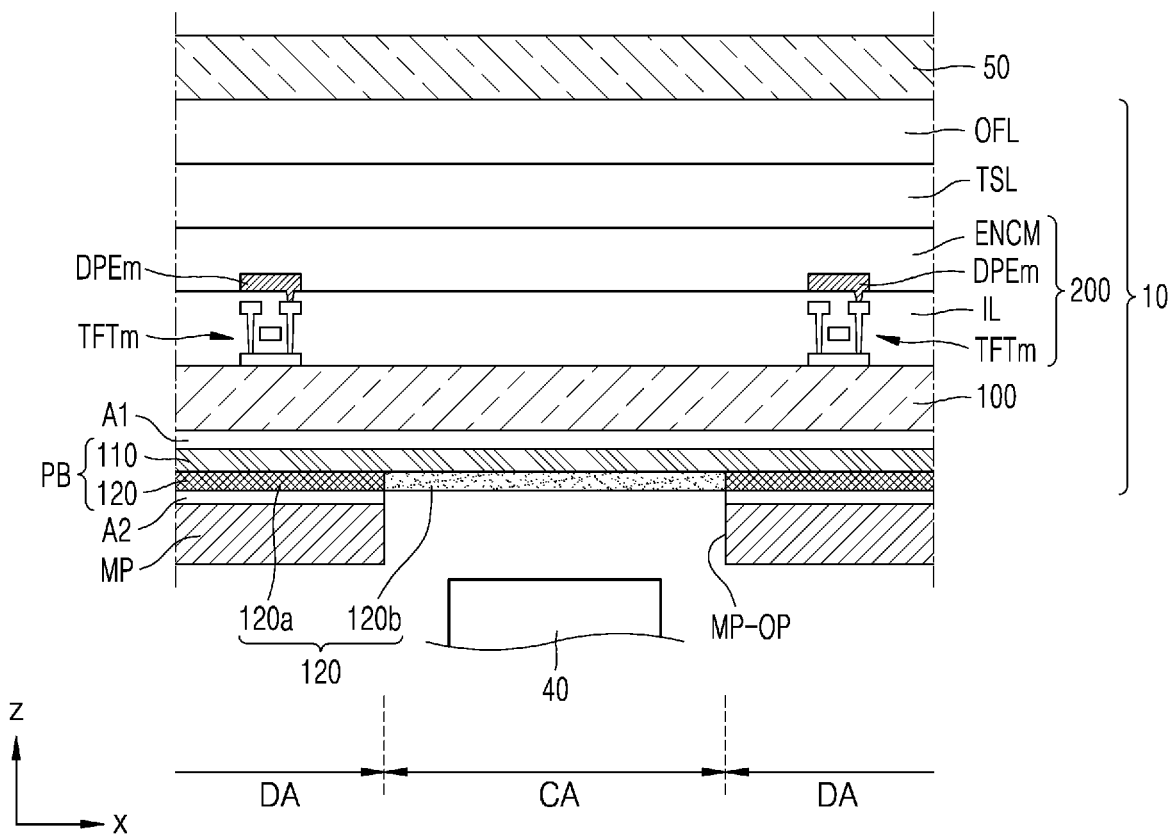
FIGS. 6A and 6B are schematic cross-sectional views of embodiments of a portion of a display apparatus.
Figure 6B:
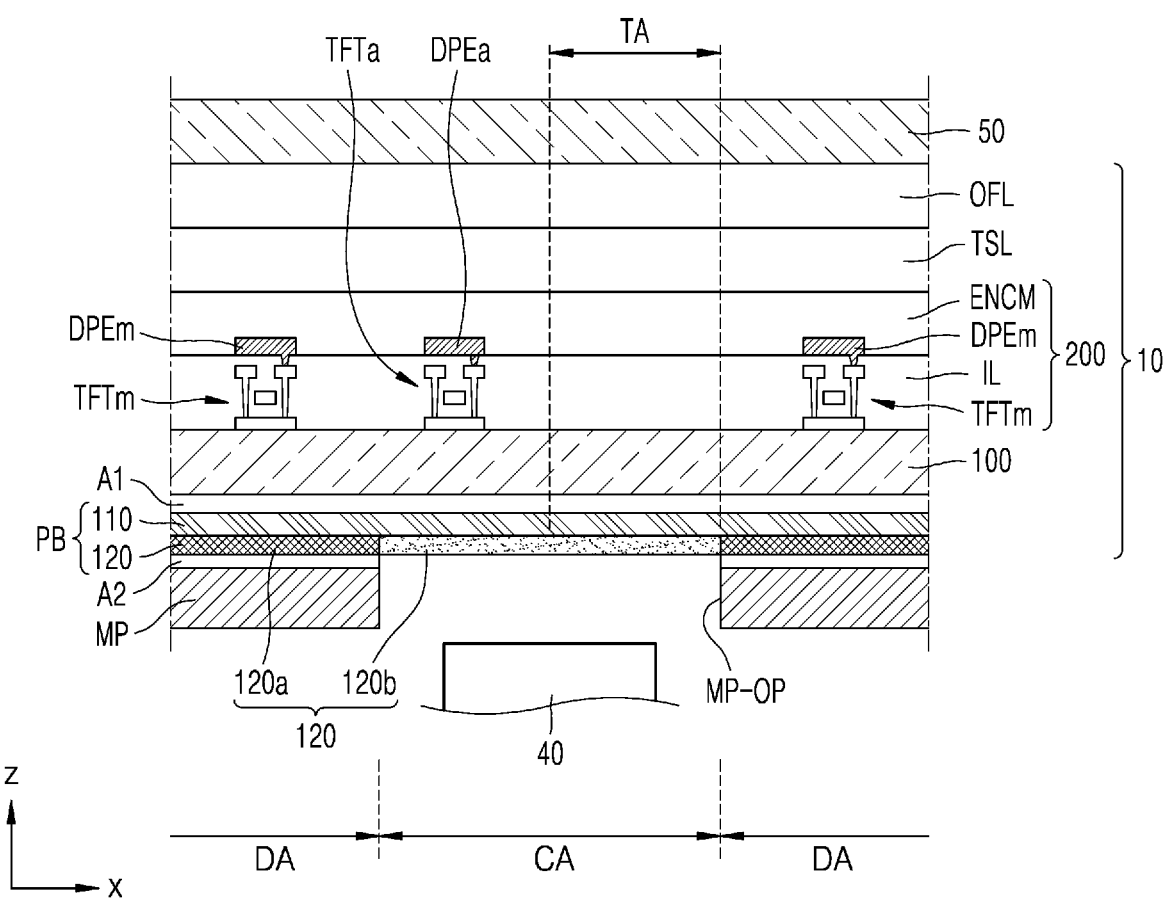

FIGS. 6A and 6B are schematic cross-sectional views of an embodiment of a portion of a display apparatus 1. Hereinafter, the same reference numerals in the drawings indicate the same components, and thus repeated descriptions thereof will be omitted.

As shown in FIGS. 6A and 6B, the cover window 50 may be located over the display panel 10, and the component 40 may be located under the display panel 10. That is, the cover window 50 may be disposed facing the component 40 with the display panel 10 therebetween. The cover window 50 may be located over the display panel 10 so as to cover the entire planar area of the display panel 10, and the component 40 may be located under the display panel 10 so as to overlap or correspond to the component area CA of the display panel 10.

The display panel 10 may include a substrate 100, a display layer 200 located on an upper surface of the substrate 100, functional layers (e.g., a touch screen layer TSL and an optical functional layer OFL) located on an upper surface of the display layer 200, and a panel protection member PB located under the substrate 100.

An insulating layer IL may be arranged between the substrate 100 and the display layer 200 and within the display layer 200 (e.g., extend into a thickness of the display layer 200).

According to an embodiment, the display layer 200 of the display panel 10 may further include an encapsulation member ENCM. The encapsulation member ENCM may be an encapsulation layer for protecting the display element DPE of the display layer 200 from external moisture or air. The encapsulation layer may include at least one organic encapsulation layer and at least one inorganic encapsulation layer. In an embodiment, for example, the encapsulation layer may include a first inorganic encapsulation layer, an organic encapsulation layer and a second inorganic encapsulation layer in order.

As described above with reference to FIG. 5A, when the display element DPE is the organic light-emitting diode OLED of FIG. 5A, the first inorganic encapsulation layer may cover the opposite electrode 223 of FIG. 5A and may include silicon oxide, silicon nitride and/or silicon trioxynitride. Other layers such as the capping layer 230 of FIG. 5A may be between the first inorganic encapsulation layer and the opposite electrode 223. Since the first inorganic encapsulation layer is provided or formed according to a structure under the first inorganic encapsulation layer and thus has an upper surface which is not flat, the organic encapsulation layer is provided or formed to cover the first inorganic encapsulation layer so as to provide a flat upper surface. The organic encapsulation layer may include at least one material from among polyethylene terephthalate, polyethylene naphthalate, polycarbonate, polyimide, polyethylene sulfonate, polyoxymethylene, polyarylate and hexamethyldisiloxane. The second inorganic encapsulation layer may cover the organic encapsulation layer and may include silicon oxide, silicon nitride and/or silicon trioxynitride.

The panel protection member PB may be under the substrate 100. The panel protection member PB may include a protective film 110 and at least one coating layer.

The protective film 110 may be located on a lower surface of the substrate 100 such that an upper surface of the protective film 110 may face the substrate 100. The protective film 110 may protect the substrate 100 from outside thereof. In an embodiment, for example, the protective film 110 may absorb an external physical impact applied from outside the substrate 100, or may prevent a foreign material, moisture or the like from permeating into the display layer 200 from outside the substrate 100. The protective film 110 may be coated on the lower surface of the substrate 100 or may be attached in the form of a film to the lower surface of the substrate 100. According to an embodiment, a first adhesive layer A1 may be between the substrate 100 and the protective film 110 and attach the substrate 100 to the panel protective member PB. The first adhesive layer A1 may assist coupling of the lower surface of the substrate 100 with a lower surface of the protective film 110. In an embodiment, for example, the first adhesive layer A1 may be, but is not limited to, an optical clear adhesive ("OCA").

The protective film 110 may correspond to both the component area CA and a portion of the display area DA which is adjacent to the component area CA. The protective film 110 may include polymer resin. In an embodiment, for example, the protective film 110 may include polyethylene terephthalate or polyimide. The protective film 110 may include a transparent material to improve the light transmittance of the component area CA.

The at least one coating layer may be arranged under the substrate 100 and may block external light and reduce the reflectance of light by the top of the at least one coating layer. The at least one coating layer may include a colorless area corresponding to the display area DA and a colored area corresponding to the component area CA. The term "corresponds to" used above refers to overlapping as viewed in a direction perpendicular to the lower surface of the substrate 100 (e.g., along the third direction or thickness direction). The colorless area of the at least one coating layer may be a planar area having a higher light transmittance than a light transmittance of the display area DA. In other words, a planar area of the at least one coating layer that overlaps the component area CA may have a higher light transmittance than a planar area of the at least one coating layer that overlaps the display area DA.

According to an embodiment, the colored area and the colorless area of the at least one coating layer may be integrated with each other. That is, the colored area and the colorless area may form an interface therebetween within the at least one coating layer. Respective lower surfaces (or respective upper surfaces) of the colored area and the colorless area of the at least one coating layer may have no step differences. In other words, the at least one coating layer may have a flat lower surface (or upper surface) over an entirety of the colored area and an entirety of the colorless area.

According to an embodiment, the at least one coating layer may include an irreversible discoloration material. The "irreversible discoloration material" refers to a material that discolors when a condition is satisfied. Since the irreversible discoloration material discolors irreversibly, the irreversible discoloration material may remain discolored even when the condition is not satisfied, after the discoloration. Accordingly, reaction and discoloration of the irreversible discoloration material during the providing or manufacture of a display apparatus 1 after discoloration or during use of the display apparatus 1 after the providing or manufacture thereof may be reduced or effectively prevented.

The irreversible discoloration material may be a colored material before discoloration and a colorless material after discoloration. In this case, the colorless area of the at least one coating layer may be a planar area where the irreversible discoloration material is changed from a colored material to a colorless material.

According to an embodiment, the irreversible discoloration material may be a colorless material before discoloration and colored material after discoloration. In this case, the colored area of the at least one coating layer may be a planar area where the irreversible discoloration material is changed from a colorless material to a colored material. The "colored material" may refer to a material of an initial color such as black, dark gray, gray or navy, but embodiments are not limited thereto. The "colored material" may refer to any material of a color capable of providing or forming an opaque area. The "colorless material" may refer to a material without color that is capable of forming a transparent area. The irreversible discoloration material may include an irreversible discoloration ink composition.

In an embodiment, for example, the irreversible discoloration material may be an irreversible hydrochromic ink composition that discolors upon contact with moisture. The irreversible hydrochromic ink composition may be changed from a colored material to a colorless material or from a colorless material to a colored material, upon contact with moisture. The irreversible hydrochromic ink composition may include a pigment, a dye, resin and/or a solvent. In embodiments, the irreversible hydrochromic ink composition may further include additives such as an emulsifier, a dispersant, a heavy agent and a plasticizer.

In an embodiment, for example, the irreversible hydrochromic ink composition may include various types of pigments for use in a printing ink, an inkjet ink and the like. In detail, the irreversible hydrochromic ink composition may include a water-soluble azo pigment, an insoluble azo pigment, a phthalocyanine pigment, a quinacridone pigment, an isoindolinone pigment, an isoindoline pigment, a ferriene pigment, a perinone pigment, a dioxazine pigment, an anthraquinone pigment, a dianthraquinonyl pigment, an anthrapyrimidine pigment, an anthanthrone pigment, an indanthrone pigment, a pravantron pigment, a pyranthrone pigment, a diketopyrropyrrole pigment, etc. Examples of inorganic pigments may include metal compounds such as metal oxides and metal complex salts. In detail, examples of inorganic pigments may include oxides of metals (such as iron, cobalt, aluminum, cadmium, lead, copper, titanium, magnesium, chromium, zinc, and antimony) or complex metal oxides, and carbon black.

The irreversible hydrochromic ink composition may include benzofuran, lactone, fluoran, an aniline-based compound, or the like independently or a combination of two or more of these materials, as dyes. However, embodiments are not limited thereto, and the irreversible hydrochromic ink composition may include any dye capable of changing a color upon contact with moisture.

The irreversible hydrochromic ink composition may include a ketonic compound and/or a cellulose-based compound as a resin.

The irreversible hydrochromic ink composition may include alcohols (such as ethanol, isopropanol, 2-propoxy ethanol, and terpineol), ketones (such as acetone), acetates (such as butylcarbitol acetate), ethoxy acetyl chloride, and the like, as a solvent. However, embodiments are not limited thereto, and the irreversible hydrochromic ink composition may include any solvent capable of dissolving a pigment, a dye and/or a resin.

As another example, the irreversible discoloration material may include a photochromic ink composition or a thermochromic ink composition. The photochromic ink composition refers to an ink composition that is changed from a colorless material to a colored material when being exposed to light such as ultraviolet light. The thermochromic ink composition refers to an ink composition that is changed from a colorless material to a colored material when a temperature condition is satisfied. In an embodiment, for example, the thermochromic ink composition may be a metal complex salt, a Kolestelic liquid crystal or a metamocolor.

As shown in FIGS. 6A and 6B, the panel protection member PB may include the protective film 110 and a first coating layer 120 which together may define a protection layer.

The first coating layer 120 may be located on a lower surface of the protective film 110 such that an upper surface of the first coating layer 120 may face the protective film 110. The first coating layer 120 may include a first colored area 120a corresponding to the display area DA, and a first colorless area 120b corresponding to the component area CA.

The first colored area 120a and the first colorless area 120b of the first coating layer 120 may be integrated with each other. The first colored area 120a and the first colorless area 120b may meet each other at a boundary therebetween and form an interface at the boundary. The first colored area 120a and the first colorless area 120b of the first coating layer 120 may not have step differences therebetween. In detail, a distance between a lower surface of the first coating layer 120 and a lower surface of the protective film 110 in the first colored area 120a of the first coating layer 120 may be equal to that in the first colorless area 120b of the first coating layer 120. In other words, the first coating layer 120 may have a lower surface that is flat over the first colored area 120a and the first colorless area 120b. The lower surface in the first colored area 120a which is furthest from the display panel 10 and the lower surface in the first colorless area 120b which is furthest from the display panel 10 may be coplanar with each other.

The first coating layer 120 may include an irreversible discoloration material, and the first colorless area 120b may be an area where the irreversible discoloration material is changed from a colored material to a colorless material. The first colored area 120a may be a remaining portion of the first coating layer 120 except for the first colorless area 120b, without being limited thereto. In an embodiment, the first colorless area 120b may be color-changed planar area of the first coating layer 120 where a color of the irreversible discoloration material is changed from an initial color to colorless (e.g., higher light transmittance). The first colored area 120a may be a planar area of the first coating layer 120 which has the initial color (e.g., color unchanged).

A metal plate MP may be arranged under the panel protection member PB. According to an embodiment, the metal plate MP may define a metal plate opening MP_OP corresponding to the component area CA. The planar area of the metal plate opening MP_OP may not be the same as the planar area of the component area CA. The component 40 may be arranged to be overlapped by the metal plate opening MP_OP. According to an embodiment, the component 40 may be arranged to further extend from the metal plate opening MP_OP and into a panel protection member opening of the panel protection member PB.

The metal plate MP may include a high modulus material. In an embodiment, for example, the metal plate MP may include at least one of invar, nobinite, stainless and an alloy thereof. Since the metal plate MP may include or be formed of a high modulus material, the metal plate MP may not be deformed even when folding and/or unfolding of the display panel 10 is repeated.

A second adhesive layer A2 may be between the metal plate MP and the panel protection member PB and may attach the metal plate MP to the panel protection member PB. The second adhesive layer A2 may assist coupling of the lower surface of the panel protection member PB with the upper surface of the metal plate MP. In an embodiment, for example, the second adhesive layer A2 may be, but is not limited to, an OCA.

According to an embodiment, as shown in FIG. 6A, the second adhesive layer A2 may define an opening corresponding to the metal plate opening MP_OP. In other words, the second adhesive layer A2 may be between the metal plate MP and the panel protection member PB within the first colored area 120a corresponding to the display area DA, and may be excluded from the first colorless area 120b corresponding to the component area CA. According to an embodiment, in contrast with FIG. 6A, the second adhesive layer A2 may be arranged so as to cover an entirety of the lower surface of the panel protection member PB without having the above-described opening. In other words, the second adhesive layer A2 may be arranged covering the lower surface of the panel protection member PB at both the first colored area 120*a* and the first colorless area 120*b*. According to an embodiment, the second adhesive layer A2 may be omitted.

FIGS. 6B, 7, 8 and 15 also illustrate that the second adhesive layer A2 defines an opening corresponding to the metal plate opening MP_OP. However, embodiments are not limited thereto. In an embodiment, for example, the second adhesive layer A2 may be arranged so as to cover an entirety of the lower surface of the panel protection member PB by excluding the opening corresponding to the metal plate opening MP_OP, or the second adhesive layer A2 may be omitted.

FIG. 6A illustrates a pixel circuit PC and a display element DPE are arranged in only the display area DA and are not arranged in (e.g., excluded from) the component area CA. The component area CA may function as an auxiliary non-display area in addition to the non-display area described above.

In detail, FIG. 6A illustrates the display layer 200 includes only a main thin-film transistor TFTm and a main display element DPEm each arranged in the display area DA. However, embodiments are not limited thereto. As shown in FIG. 6B, a pixel circuit PC and a display element DPE are arranged not only in the display area DA but also in the component area CA.

As shown in FIG. 6B, the display panel 10 may include the main thin-film transistor TFTm and the main display element DPEm arranged in the display area DA, and an auxiliary thin-film transistor TFTa and an auxiliary display element DPEa arranged in the component area CA. The component area CA may function as an auxiliary display area. The component area may include the auxiliary thin-film transistor TFTa and the auxiliary display element DPEa each provided in plural including auxiliary thin-film transistors TFTa and auxiliary display elements DPEa, respectively.

A planar area of the component area CA that has none of the auxiliary display elements DPEa arranged therein may be a transmission area TA through which light is transmitted. A plurality of transmission areas TA may be provided in the component area CA. The transmission area TA may transmit a light/signal emitted by the component 40 arranged to correspond to the component area CA or a light/signal incident upon the component 40. The auxiliary display elements DPEa and transmission areas TA may alternate with each other along the component area CA. Since the component area CA has the transmission areas TA, the resolution of the component area CA may be lower than the resolution of the display area DA. In an embodiment, for example, the resolution of the component area CA may be about ½, about ⅜, about ⅓, about ¼, about ⅖, about ⅛, about ⅑ or about 1/16 of the resolution of the display area DA.

FIGS. 7 through 15 are illustrated based on the embodiment of FIG. 6A, but the description below is also equally applicable to the embodiment of FIG. 6B.

Figure 7:
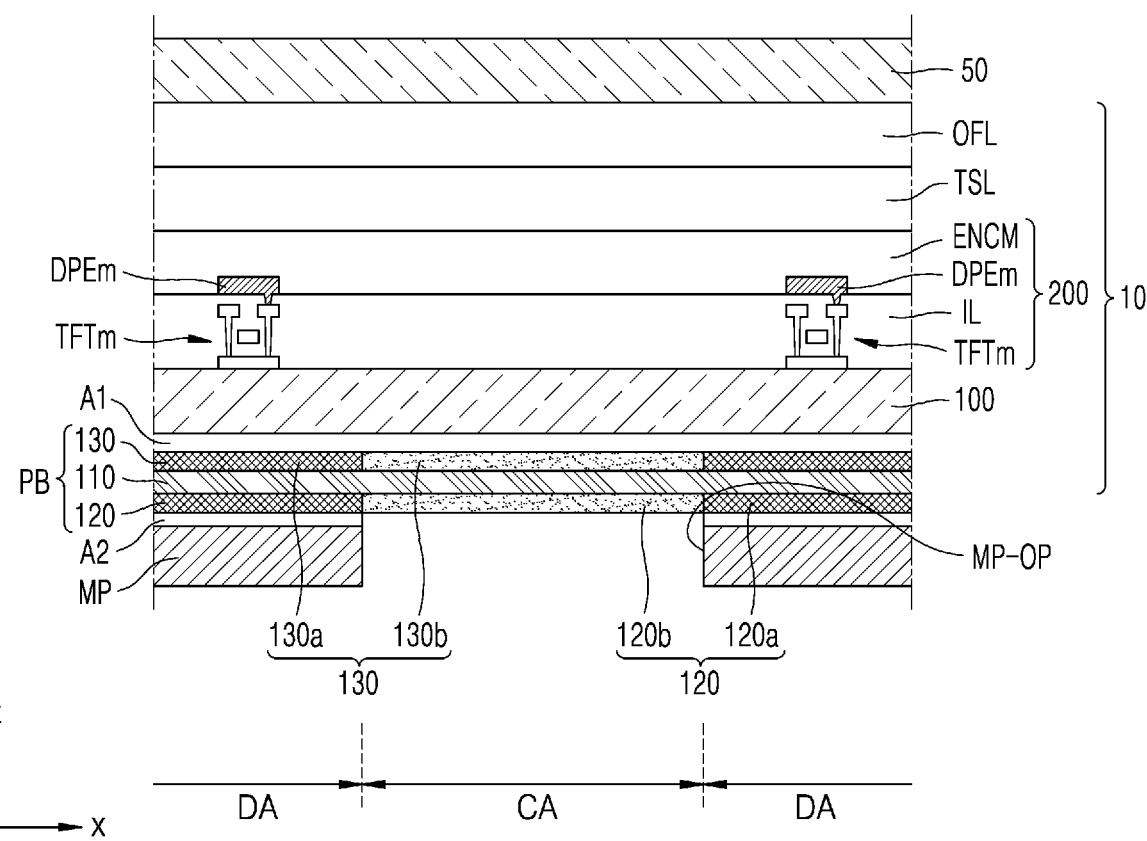
FIG. 7 is a schematic cross-sectional view of an embodiment of a portion of a display apparatus.

FIG. 7 is a schematic cross-sectional view of an embodiment of a portion of a display apparatus 1.

As shown in FIG. 7, the panel protection member PB may include a second coating layer 130. In other words, the panel protection member PB may include the protective film 110, the first coating layer 120 facing the protective film 110, and the second coating layer 130 facing the first coating layer 120 with the protective film 110 therebetween. In this case, the display layer 200 may be provided or formed over the second coating layer 130. According to the embodiment, since the display apparatus 1 includes a plurality of coating layers under the substrate 100, the display apparatus 1 may more effectively block external light and reduce the reflectance of light by the top of the plurality of coating layers.

The second coating layer 130 may be located between the protective film 110 and the substrate 100 such that an upper surface of the second coating layer 130 may face the substrate 100 and be closest to the display panel 10. The above descriptions of the first coating layer 120 are equally applicable to the second coating layer 130.

In detail, the second coating layer 130 may include a second colored area 130*a* corresponding to the component area CA, and a second colorless area 130*b* corresponding to the display area DA.

The second colored area 130*a* and the second colorless area 130*b* of the second coating layer 130 may be integrated with each other. The second colored area 130*a* and the second colorless area 130*b* of the second coating layer 130 may not have step differences therebetween. In detail, a distance between an upper surface of the second coating layer 130 and the upper surface of the protective film 110 in the second colored area 130*a* of the second coating layer 130 may be equal to that in the second colorless area 130*b* of the second coating layer 130. In other words, the second coating layer 130 may have an upper surface that is flat over an entirety of the second colored area 130*a* and the second colorless area 130*b*. In an embodiment, the second coating layer 130 includes an upper surface which is closest to the substrate 100, and within the second coating layer 130 the upper surface at the second colorless area 130*b* and the upper surface at the second colored area 130*a* are coplanar with each other.

The second coating layer 130 may include the above-described irreversible discoloration material. The second colorless area 130*b* may be an area where the irreversible discoloration material is changed from a colored material to a colorless material.

Figure 8:
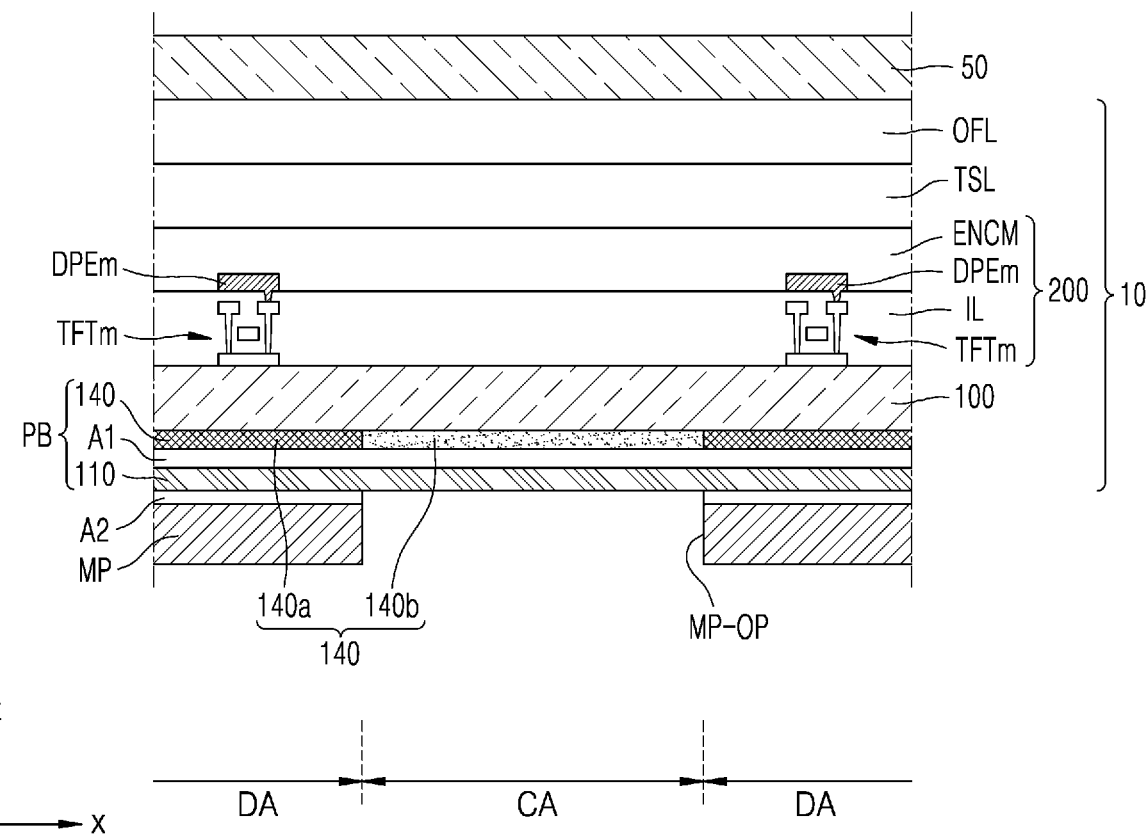
FIG. 8 is a cross-sectional view of an embodiment of a portion of a display apparatus.

FIG. 8 is a cross-sectional view of an embodiment of a portion of a display apparatus 1.

As shown in FIG. 8, the panel protection member PB may include the protective film 110, and a third coating layer 140 which is located over the protective film 110. According to the embodiment, a coating layer may be provided or formed directly on the lower surface of the substrate 100 of the display panel 10, to provide an interface between the coating layer and the substrate 100. In this case, the protective film 110 may be located on a lower surface of the third coating layer 140 such that an upper surface of the protective film 110 may face the third coating layer 140. According to an embodiment, a first adhesive layer A1 may be between the protective film 110 and the third coating layer 140 and attach the protective film 110 to the third coating layer 140. The first adhesive layer A1 may assist coupling of the upper surface of the protective film 110 with the lower surface of the third coating layer 140.

The third coating layer 140 is located on the lower surface of the substrate 100 such that an upper surface of the third coating layer 140 may face the substrate 100. The above descriptions of the first and second coating layers 120 and 130 are equally applicable to the third coating layer 140.

In detail, the second coating layer 130 may include a third colored area 140*a* corresponding to the component area CA, and a third colorless area 140*b* corresponding to the display area DA.

The third colored area 140*a* and the third colorless area 140*b* of the third coating layer 140 may be integrated with each other. The third colored area 140*a* and the third colorless area 140*b* of the third coating layer 140 may not have step differences therebetween. In detail, a distance between a lower surface of the third coating layer 140 and the lower surface of the substrate 100 in the third colored area 140a of the third coating layer 140 may be equal to that in the third colorless area 140b of the third coating layer 140. In other words, the third coating layer 140 may have a lower surface that is flat over an entirety of the third colored area 140a and the third colorless area 140b.

The third coating layer 140 may include the above-described irreversible discoloration material. The third colorless area 140b may be an area where the irreversible discoloration material is changed from a colored material to a colorless material.

FIGS. 9 through 15 are cross-sectional views illustrating an embodiment of a method of providing or manufacturing a display apparatus 1.

Figure 9:
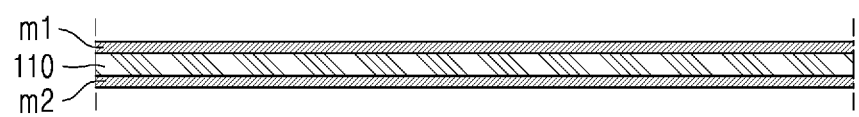
FIGS. 9 through 15 are cross-sectional views illustrating an embodiment of a method of providing a display apparatus.
Figure 9:
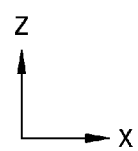

As shown in FIG. 9, the protective film 110 of which the upper surface and the lower surface are covered with release paper may be prepared. The "release paper" is laminated or taped on an adhesive surface and an adhesion surface, and may reduce or effectively prevent the adhesive surface or the adhesion surface from being exposed to foreign substances or moisture or suffering physical damage, such as scratches, during a manufacturing process. Referring to FIG. 9, upper release paper m1 (e.g., first release paper) may be arranged on the upper surface of the protective film 110, and lower release paper m2 (e.g., second release paper) may be arranged on the lower surface of the protective film 110.

Figure 10:
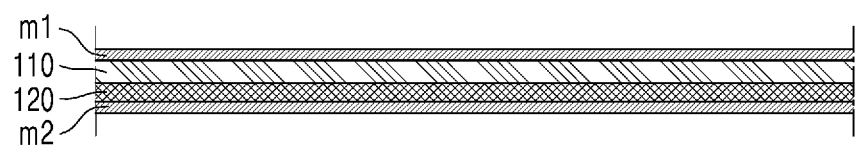
Figure 10:
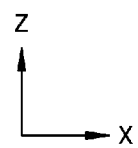

Then, as shown in FIG. 10, the first coating layer 120 is provided or formed on the lower surface of the protective film 110. In more detail, the lower release paper m2 is removed from the lower surface of the protective film 110, the first coating layer 120 including an irreversible discoloration material having an initial color is provided or formed on the lower surface of the protective film 110, and the lower release paper m2 is arranged on the lower surface of the first coating layer 120. According to an embodiment, the lower release paper m2 arranged after the first coating layer 120 may be a new release paper rather than a result of recycling of the lower release paper m2 removed in advance to reduce or effectively prevent inflow of foreign materials, moisture or the like.

The first coating layer 120 may include an irreversible hydro chromic material that is changed from a colored material to a colorless material upon contact with moisture. According to an embodiment, the first coating layer 120 may be provided or formed using a Gravure printing method. The Gravure printing method is an intaglio printing method using a copper plate. In detail, in the Gravure printing method, a copper plate is produced via gravure engraving, and ink is transferred to a blanket and indirectly printed on a printed object. However, a method of providing or forming the first coating layer 120 is not limited to the above-described example, and the first coating layer 120 may be formed using various printing methods such as an inkjet process and a mask process. According to an embodiment, a thickness of the first coating layer 120 along the z direction may be within about 50 micrometers (µm). A printing dry time may be about two minutes to about three minutes in a temperature range of 60 degrees Celsius (° C.) to about 130° C.

Figure 11:
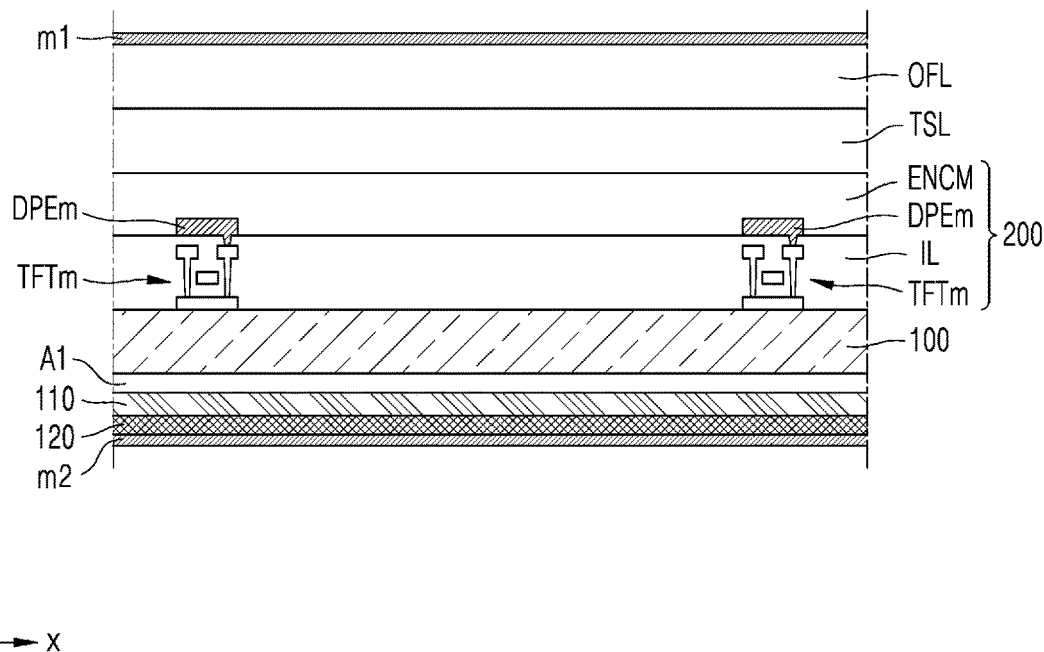

Then, as shown in FIG. 11, the substrate 100 and components located over the substrate 100, which are included in the display panel 10, are provided or formed on the upper surface of the protective film 110. In more detail, the upper release paper m1 is removed from the upper surface of the protective film 110, and the substrate 100 having the component area CA and the display area DA which is adjacent to the component area CA is arranged on the upper surface of the protective film 110. The display layer 200 is provided or formed on the substrate 100. According to an embodiment, after the display layer 200 is provided or formed, various functional layers (for example, a touch screen layer TSL and an optical functional layer OFL) may be provided or formed on the display layer 200. Then, the upper release paper m1 is arranged over the display panel 10. That is, the method includes providing on an upper surface of the first coating layer 120 which is opposite to the lower surface of the first coating layer 120, in order from the first coating layer 120 a substrate 100 including a component area CA corresponding to a functional component of the display apparatus 1 and a display area DA which is adjacent to the component area CA, and a display layer 200 in the component area CA and in the display area DA.

The upper release paper m1 arranged over the display panel 10 after the substrate 100 and the components of the display panel 10 located over the substrate 100 are provided or formed may be new release paper rather than a result of recycling the upper release paper m1 removed in advance to reduce or effectively prevent inflow of a foreign material, moisture or the like. The display layer 200 of the display panel 10 provided or formed may include the auxiliary display element DPEa of FIG. 6A with or without the auxiliary thin-film transistor TFTa of FIG. 6B arranged in the component area CA.

Figure 12:
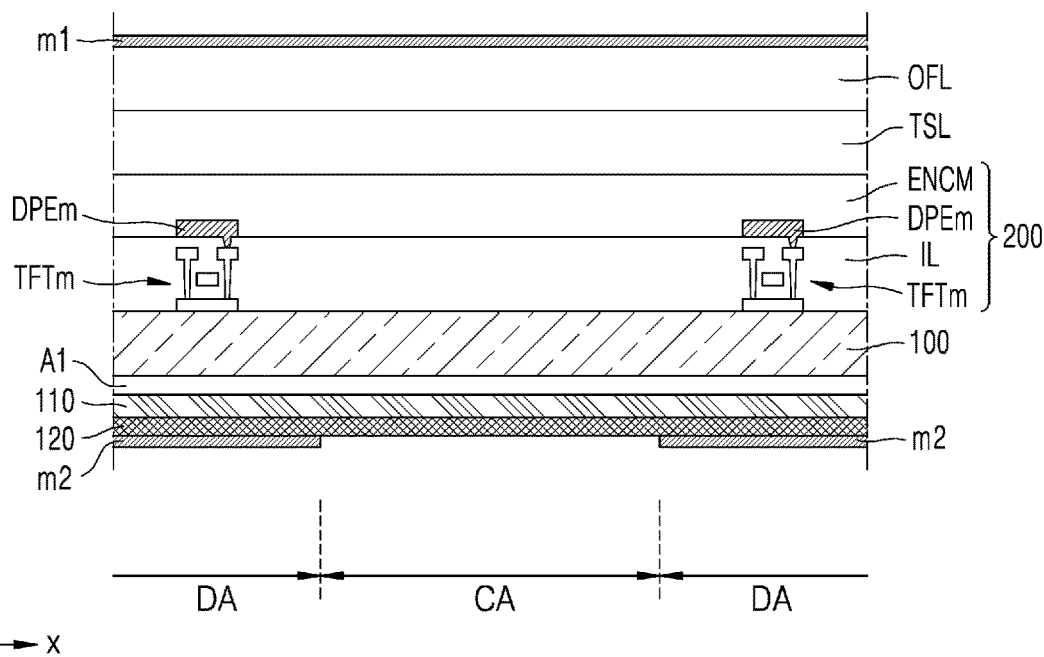
Figure 13:
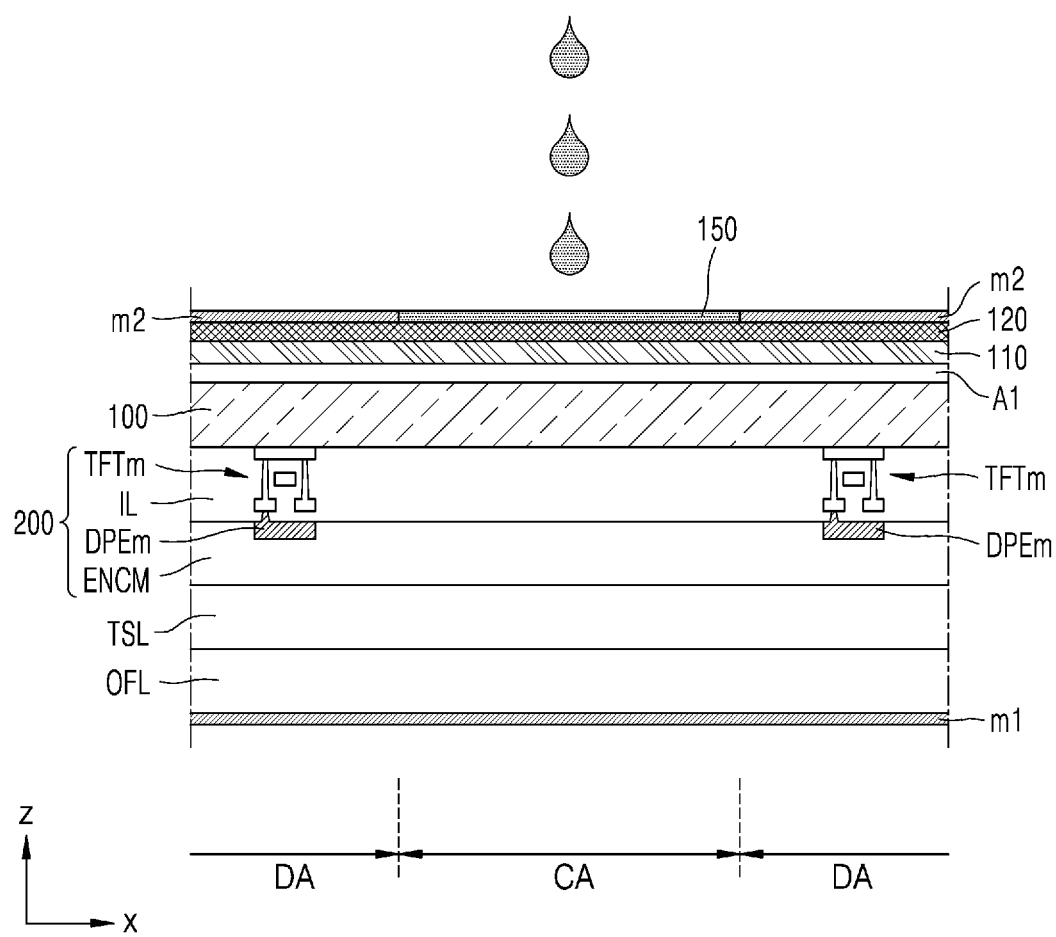
Figure 14:
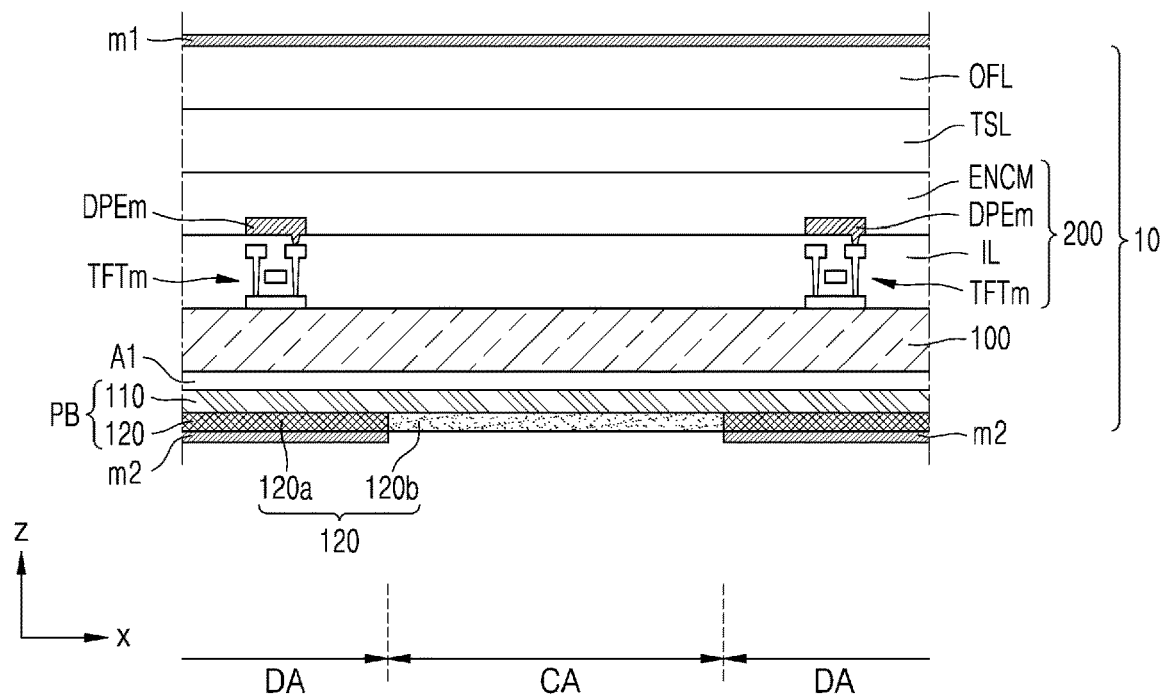

As shown in FIGS. 12 through 14, the first coating layer 120 is patterned so as to have the first colored area 120a corresponding to the display area DA and the first colorless area 120b corresponding to the component area CA.

The patterning of the first coating layer 120 may include providing or forming an opening in the lower release paper m2 which exposes a portion of the irreversible discoloration material to outside the lower release paper m2 and providing or forming the first colorless area 120b in the first coating layer 120. The first coating layer 120 is exposed outside of the lower release paper m2 at the opening in the lower release paper m2.

The forming of the opening in the lower release paper m2 includes providing or forming the opening by removing a planar area of the lower release paper m2 arranged on the lower surface of the first coating layer 120 which corresponds to the component area CA. According to an embodiment, the opening may be provided or formed in the lower release paper m2 by using a laser. In other words, only a portion of the lower release paper m2 located in a planar area corresponding to the component area CA may be selectively removed by applying laser energy to the lower surface of the lower release paper m2. A $CO_2$ laser, a YAG laser, a nanosecond laser, a femtosecond laser, a Bessel beam or a Gaussian beam, for example, may be applied, but embodiments are not limited thereto.

The providing or forming of the first colorless area 120b in the first coating layer 120 includes providing or forming the first colorless area 120b in a planar area of the first coating layer 120 that corresponds to the opening of the lower release paper m2.

According to an embodiment, when the first coating layer 120 includes an irreversible hydrochromic material that discolors (e.g., is defined by a color-changed portion) upon contact with moisture, the providing or forming of the first colorless area 120b in the first coating layer 120 may include an operation of supplying moisture to the lower surface of the first coating layer 120 which is exposed to outside the lower release paper m2 via the opening in the lower release paper m2 and an operation of drying the supplied moisture after a time has lapsed.

The supplying of the moisture includes supplying the moisture to the lower surface of the first coating layer 120 which is exposed to outside the lower release paper m2 via the opening of the lower release paper m2. FIG. 13 illustrates an operation of supplying moisture (e.g., illustrated as droplets) such as by using a dispenser drop method. However, a moisture supplying method is not limited thereto, and an arbitrary method of contacting moisture to a coating layer is applicable.

Referring to FIG. 13, the dispenser drop method is applicable to the supplying of the moisture to the lower surface of the first coating layer 120. In the dispenser drop method, an amount of moisture is supplied to the lower surface of the first coating layer 120 by using a dispenser. A dispenser arranged to overlap the first coating layer 120 supplies moisture to the exposed lower surface of the first coating layer 120. The supplied moisture may reach the exposed lower surface of the first coating layer 120 only through the opening in the lower release paper m2. Accordingly, the lower release paper m2 may serve as a mask so that a discoloration reaction (e.g., color change) may occur only in the component area CA of the first coating layer 120.

The moisture that reaches the lower surface of the first coating layer 120 through the opening in the lower release paper m2 forms a moisture layer 150. The moisture layer 150 overlaps a discoloration area of the first coating layer 120. In an embodiment, for example, the moisture layer 150 may be provided or formed on the lower surface of the first coating layer 120 so as to overlap the component area CA. In a planar area where the moisture layer 150 is located, the first coating layer 120 and the moisture of the moisture layer 150 may react with each other, and a portion of the first coating layer 120 may be discolored. In an embodiment, for example, the first coating layer 120 may be changed from a colored material to a colorless material in a planar area of the first coating layer 120 which corresponds to the moisture layer 150.

A time period during which the first coating layer 120 contacts the moisture layer 150, namely, a time period taken for the first coating layer 120 to discolor, may be, but is not limited to, about 20 seconds to about 40 seconds.

The discoloration area of the first coating layer 120 may have a volume that is constant. In other words, in a cross-section of the first coating layer 120, a thickness of the discoloration area of the first coating layer 120 may be constant. A thickness of the discoloration area may be taken from the lower surface of the first coating layer 120. Accordingly, the first coating layer 120 may have a flat lower surface without having a step difference between a colored area and a colorless area thereof.

As shown in FIG. 13, the supplying of moisture to the first coating layer 120 may be performed when the lower surface of the lower release paper m2 is located at the top. Thus, the moisture supplied to the lower surface of the lower release paper m2 may contact and react with the lower release paper m2 without being affected by gravity.

After the discoloration reaction of the first coating layer 120 is completed, the supplied moisture is dried. In detail, when the moisture layer 150 is provided or formed on the lower surface of the first coating layer 120 and then a time period lapses, the moisture layer 150 is removed through the drying. The "time period" may refer to a time period for the discoloration reaction of the first coating layer 120 to be completed. According to an embodiment, the drying may be a natural drying method or a non-natural drying method in which energy (for example, thermal energy) is provided to accelerate or assist the drying.

Referring to FIG. 14, through the moisture supplying and the drying, the first coating layer 120 includes the first colored area 120a having an initial colored material since no discoloration reaction occurs, and the first colorless area 120b having a color-changed material which is changed from a colored material to a colorless material through a discoloration reaction.

Figure 15:
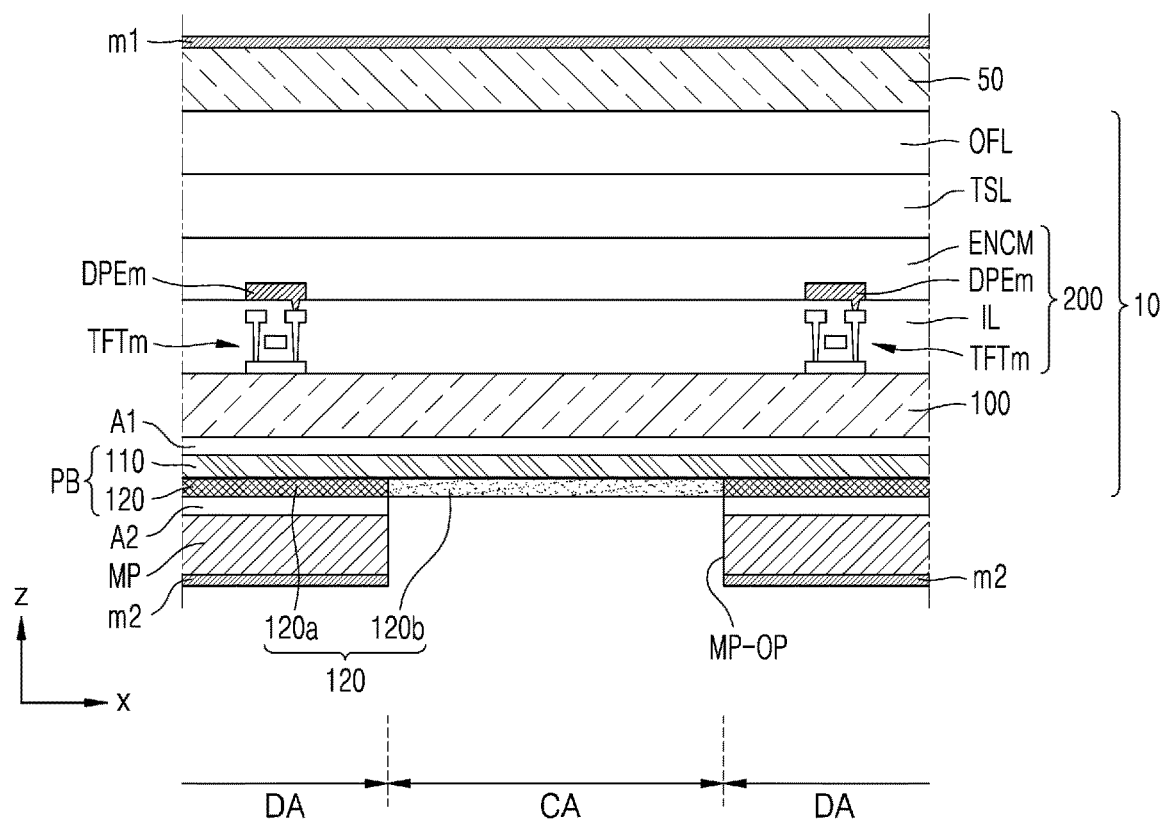

As shown in FIG. 15, the metal plate MP and the cover window 50 may be further provided or formed. In more detail, the upper release paper m1 arranged over the display panel 10 is removed, the cover window 50 is arranged over the display panel 10, and the upper release paper m1 is arranged over the cover window 50. The lower release paper m2 is removed from the lower surface of the first coating layer 120, the metal plate MP is provided or formed under the first coating layer 120, and the lower release paper m2 is arranged on the lower surface of the first coating layer 120.

The display apparatus 1 may include at least one of the first, second and third coating layers 120, 130 and 140 described above. Accordingly, the method of providing or manufacturing the display apparatus 1 may include at least one of the operations of providing or forming the first coating layer 120, providing or forming the second coating layer 130 and providing or forming the third coating layer 140. The same method as that for providing of the first coating layer 120 described above with reference to FIGS. 9 through 15 is applicable to providing of the second coating layer 130 and providing of the third coating layer 140. In this case, the order of providing or forming the first coating layer 120, the second coating layer 130 and/or the third coating layer 140 is not restricted.

In an embodiment, for example, the providing or forming of the second coating layer 130 may further include an operation of providing forming the second coating layer 130 including an irreversible discoloration material on the upper surface of the protective film 110 and arranging the upper release paper m1 on the upper surface of the second coating layer 130, and an operation of patterning the second coating layer 130 such that the second coating layer 130 has the second colorless area 130b corresponding to the component area CA and the second colored area 130a corresponding to the display area DA.

The patterning of the second coating layer 130 may include an operation of providing or forming an opening corresponding to the component area CA in the upper release paper m1, and an operation of providing or forming the second colorless area 130b in an area of the second coating layer 130 that overlaps the opening of the upper release paper m1. The providing or forming of the second colorless area 130b may include an operation of supplying moisture to the upper surface of the second coating layer 130 which is exposed to outside the upper release paper m1 via the opening of the upper release paper m1, and an operation of drying the moisture after a time has lapsed. In an embodiment, for example, the providing or forming of the third coating layer 140 may further include an operation of providing or forming the third coating layer 140 including an irreversible discoloration material on the lower surface of the substrate 100 and arranging a lower release paper m2 on the lower surface of the third coating layer 140, and an operation of patterning the third coating layer 140 such that the third coating layer 140 has the third colorless area 140b corresponding to the component area CA and the third colored area 140*a* corresponding to the display area DA.

The patterning of the third coating layer 140 may include an operation of providing or forming an opening corresponding to the component area CA of the lower release paper m2, and an operation of providing or forming the third colorless area 140*b* in an area of the third coating layer 140 that overlaps the opening in the lower release paper m2. The providing or forming of the third colorless area 140*b* may include an operation of supplying moisture to the lower surface of the third coating layer 140 which is exposed to outside the lower release paper m2 via the opening of the lower release paper m2, and an operation of drying the moisture after a time has lapsed.

According to an embodiment as described above, a display apparatus 1 capable of improving transmittance of a component area CA and reducing reflectance of light, and a method of providing or manufacturing the display apparatus 1 may be realized. Of course, the scope of the disclosure is not limited thereto.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic apparatus comprising:
   a display apparatus comprising:
   a substrate comprising a component area corresponding to a functional component of the display apparatus and a display area which is adjacent to the component area;
   a display layer in the component area and in the display area, on the substrate; and
   a first single layer which faces the display layer with the substrate therebetween, the first single layer including a material having an initial color,
   wherein the first single layer is defined by a first color-changed portion of the material being color-changed from the initial color to colorless together with a first color-unchanged portion of the material being color-unchanged to have the initial color.

2. The electronic apparatus of claim 1, wherein
   the first single layer of the material is continuously disposed in both the component area and the display area, and
   the first color-changed portion and the first color-unchanged portion of the material form an interface therebetween.

3. The electronic apparatus of claim 2, wherein
   the first single layer includes a lower surface which is furthest from the substrate, and
   the lower surface at the first color-changed portion and the lower surface at the first color-unchanged portion are coplanar with each other.

4. The electronic apparatus of claim 1, wherein within the first single layer, the material at the component area is color-changed to define the first color-changed portion together with the material at the display area being color-unchanged to define the first color-unchanged portion.

5. The electronic apparatus of claim 1, wherein the material of the first single layer includes an irreversible hydrochromic material which changes from the initial color to colorless by contact with moisture.

6. The electronic apparatus of claim 1, further comprising a second single layer of the material which is between the first single layer and the substrate and has the initial color,
   wherein the second single layer is defined by a second color-changed portion of the material being color-changed from the initial color to colorless together with a second color-unchanged portion of the material being color-unchanged to have the initial color.

7. The electronic apparatus of claim 6, wherein
   the second single layer of the material is continuously disposed in both the component area and the display area, and
   the second color-changed portion and the second color-unchanged portion of the material form an interface therebetween.

8. The electronic apparatus of claim 7, wherein
   the second single layer includes an upper surface which is closest to the substrate, and
   within the second single layer the upper surface at the second color-changed portion and the upper surface at the second color-unchanged portion are coplanar with each other.

9. The electronic apparatus of claim 6, wherein within the second single layer, the material at the component area is color-changed to define the second color-changed portion together with the material at the display area being color-unchanged to define the second color-unchanged portion.

10. The electronic apparatus of claim 6, wherein the material of the second single layer includes an irreversible hydrochromic material which changes from the initial color to colorless by contact with moisture.

11. The electronic apparatus of claim 6, further comprising a multilayer panel protective layer comprising:
    the first single layer of the material continuously disposed in both the component area and the display area,
    the second single layer of the material continuously disposed in both the component area and the display area, and
    a protective film between the first single layer of the material and the second single layer of the material.

12. The electronic apparatus of claim 11, wherein the multilayer panel protective layer faces the display layer with the substrate therebetween.

13. The electronic apparatus of claim 1, further comprising a multilayer panel protective layer comprising:
    the first single layer of the material continuously disposed in both the component area and the display area, and
    a protective film between the first single layer of the material and the substrate.

14. The electronic apparatus of claim 13, wherein the multilayer panel protective layer faces the display layer with the substrate therebetween.

* * * * *